(12) United States Patent
Yiang et al.

(10) Patent No.: US 8,975,133 B2
(45) Date of Patent: Mar. 10, 2015

(54) CAPACITORS POSITIONED AT THE DEVICE LEVEL IN AN INTEGRATED CIRCUIT PRODUCT AND METHODS OF MAKING SUCH CAPACITORS

(75) Inventors: Kok Yong Yiang, Santa Clara, CA (US); Patrick R. Justison, Fremont, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 324 days.

(21) Appl. No.: 13/568,802

(22) Filed: Aug. 7, 2012

(65) Prior Publication Data
US 2014/0042510 A1 Feb. 13, 2014

(51) Int. Cl.
*H01L 21/8242* (2006.01)

(52) U.S. Cl.
USPC ........... 438/239; 438/170; 438/171; 438/238; 438/243; 438/244; 257/300; 257/304; 257/E27.016; 257/E27.02; 257/E21.616

(58) Field of Classification Search
None
See application file for complete search history.

(56) References Cited

U.S. PATENT DOCUMENTS

2012/0119302 A1    5/2012  Pei et al.

*Primary Examiner* — Yasser A Abdelaziez
(74) *Attorney, Agent, or Firm* — Amerson Law Firm, PLLC

(57) ABSTRACT

One illustrative integrated circuit product disclosed herein includes a metal-1 metallization layer positioned above a semiconducting substrate, a capacitor positioned between a surface of the substrate and a bottom of the metal-1 metallization layer, wherein the capacitor includes a plurality of conductive plates that are oriented in a direction that is substantially normal relative to the surface of the substrate, and at least one region of insulating material positioned between the plurality of conductive plates.

19 Claims, 18 Drawing Sheets

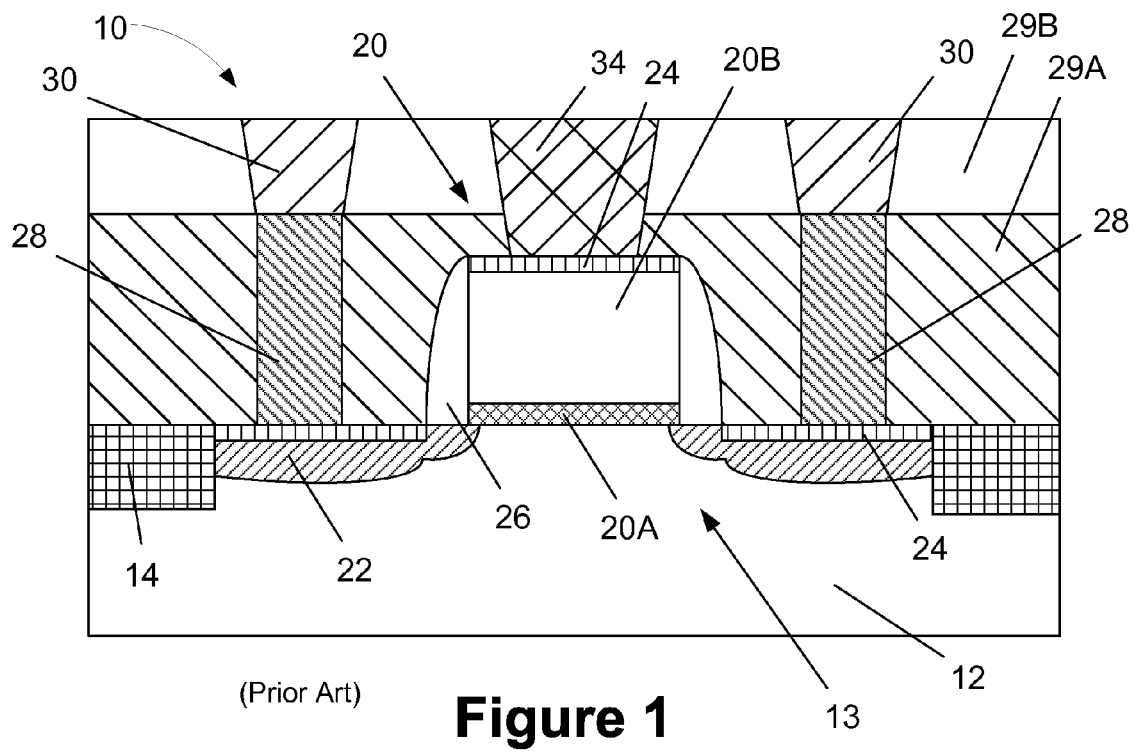
(Prior Art) Figure 1
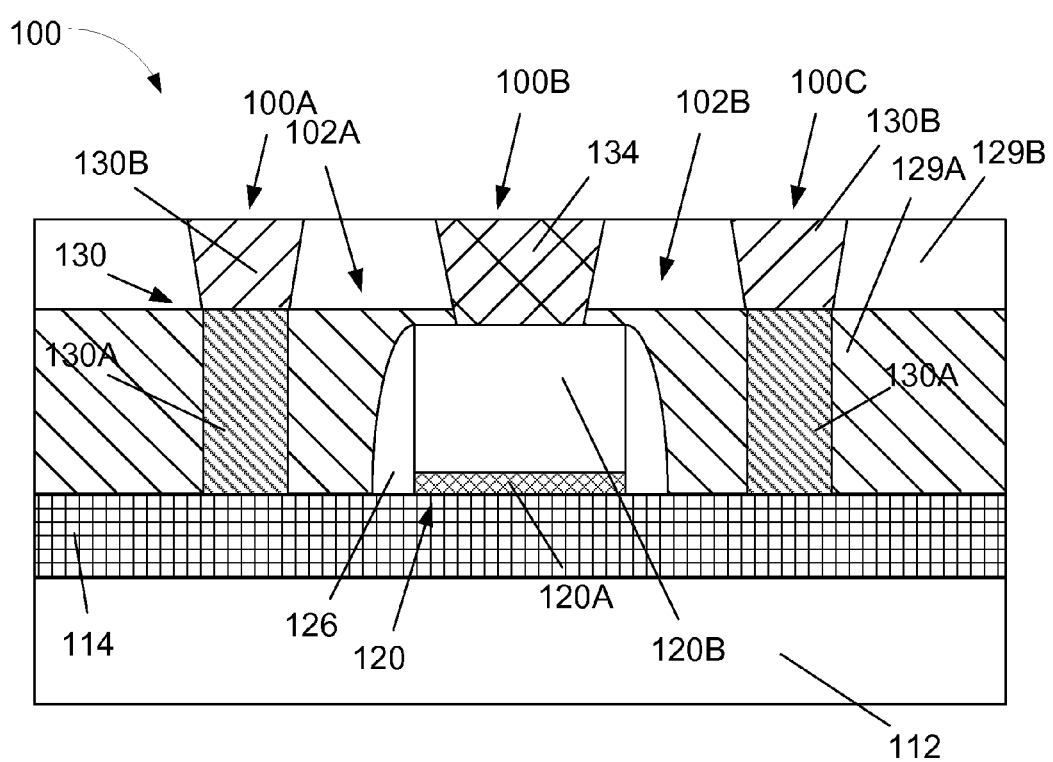
Figure 2A

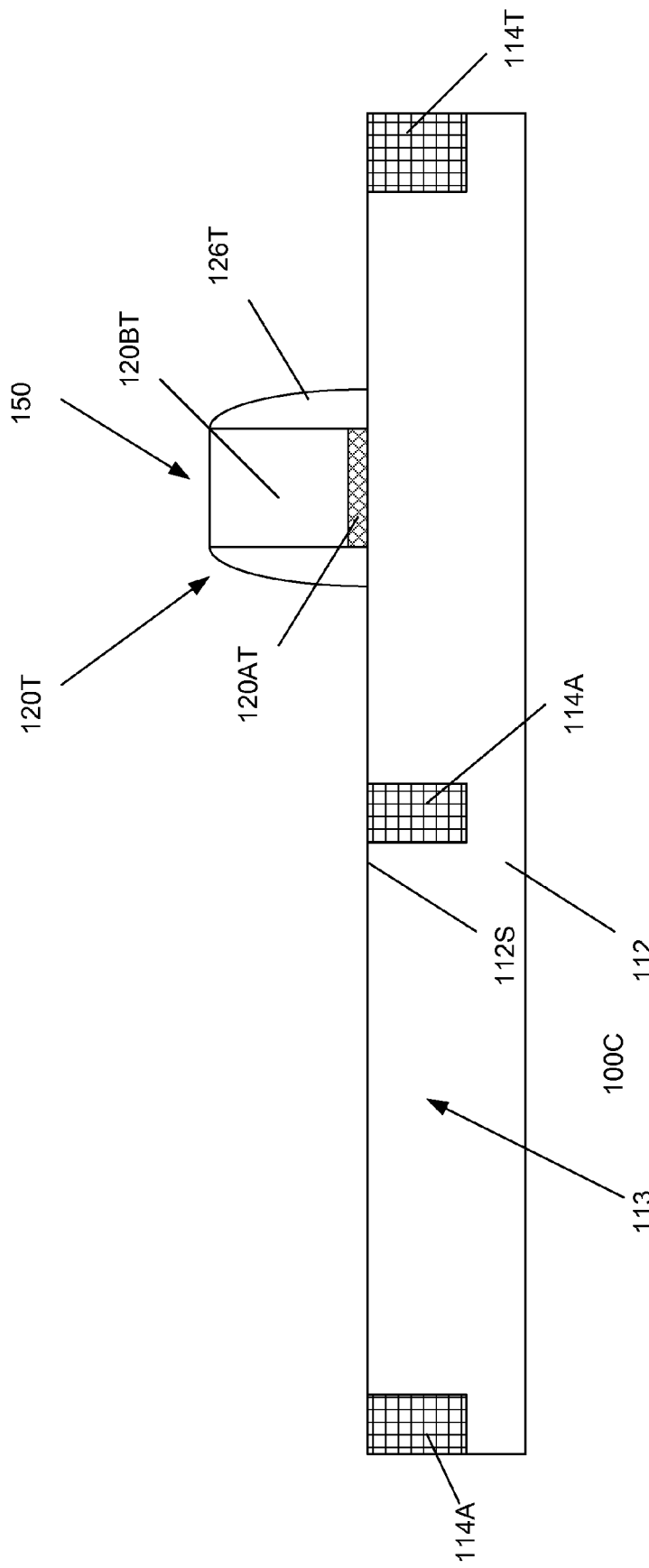

CAPACITORS POSITIONED AT THE DEVICE LEVEL IN AN INTEGRATED CIRCUIT PRODUCT AND METHODS OF MAKING SUCH CAPACITORS

BACKGROUND

1. Field of the Disclosure

Generally, the present disclosure relates to sophisticated integrated circuits, and, more particularly, to various embodiments of a capacitor structure positioned at the device level of an integrated circuit product, and various methods of making such capacitors and products.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

FIG. 1 is a simplified view of an illustrative prior art transistor device 10 that is formed above a semiconducting substrate 12. The device 10 is formed in and above an active region 13 that is defined in the substrate 10 by an illustrative trench isolation structure 14. The transistor 10 includes a schematically depicted gate electrode structure 20 (that typically includes a gate insulation layer 20A and a gate electrode 20B), a plurality of source/drain regions 22, sidewall spacers 26, and a plurality of metal silicide regions 24. Also depicted in FIG. 1 are a plurality of conductive contact structures that are conductively coupled to the source/drain regions 22 and the gate electrode 20B. Such conductive contact structures are formed in layers of insulating material 29A, 29B, e.g., silicon dioxide, and the conductive contact structures may take a variety of forms. In the depicted example, the source/drain regions 22 are contacted by so-called source/drain interconnects 28 that contact so-called trench silicide regions (not shown) in the source/drain regions 22. Illustrative source/drain contacts 30 contact the source/drain interconnects 28. The gate electrode 20B is electrically contacted by a gate contact 34. The illustrative source/drain regions 22 depicted in FIG. 1 have an upper surface that is approximately level with the upper surface of the substrate 12. Transistors with so-called raised source/drain regions are also known in the art.

The various structures and regions of the transistor 10 depicted in FIG. 1 may be formed by performing well-known semiconductor manufacturing processes. For example, the gate structure 20 may be formed by depositing various layers of material and thereafter performing one or more etching process to define the basic layer stack of the gate structure 20. The sidewall spacers 26 may be formed by depositing a layer of spacer material, such as silicon nitride, and thereafter performing an anisotropic etching process on the layer of spacer material. The source/drain regions 22 may be formed using known ion implantation techniques using the appropriate dopant materials, i.e., N-type dopants or P-type dopants, depending upon the device under construction. The metal silicide regions 24 may be formed by performing traditional silicidation processes, i.e., depositing a layer of refractory metal, performing a heating process causing the refractory metal to react with underlying silicon-containing material, removing unreacted portions of the layer of refractory metal (e.g., nickel, platinum or combinations thereof), followed perhaps by performing an additional heating process. The conductive structures 28, 30, 34 that provide electrical connection to the source/drain regions 22 and the gate electrode 20B may be formed using well-known processes.

Although not depicted in FIG. 1, a plurality of so-called metallization layers are formed above the device 10, e.g., 7-14 metallization layers. The metallization layers are comprised of conductive lines and/or conductive vias that are positioned in a layer of insulating material. In general, the conductive lines and vias in the metallization layers constitute the "wiring" pattern that connects various semiconductor devices, e.g., transistors, capacitors, resistors, together in a desired configuration to create a working integrated circuit product. As to terminology, the transistor 10 is generally formed at what is known as the "device level" of an integrated circuit product, as that is the level at which discrete devices, e.g., transistors, resistors, are formed in the semiconducting substrate 10. So-called "front end-of-line" ("FEOL") processes generally refer to all to the processing from wafer start through final contact window processing. FEOL processes include formation of the gate structure 20, the isolation region 14, the source/drain regions 22, etc., including the activation anneal of the source/drain regions 22. So-called "back end-of-line" ("BEOL") processes generally refer to the process steps after formation of the conductive contact structures shown in FIG. 1 through completion of the wafer prior to wafer electrical test, i.e., BEOL processing is typically considered to begin with the formation of the first general "wiring" layer for the device, the so-called "metal-1" layer, formed on the wafer.

In modern, ultra-high density integrated circuits, device features have been steadily decreased in size to enhance the performance of the semiconductor device and the overall functionality of the circuit. For example, the gate length (the distance between the source and drain regions) on modern transistor devices may be approximately 20-50 nm and further scaling (reduction in size) is anticipated in the future. This ongoing and continuing decrease in the channel length of transistor devices has improved the operating speed of the transistors and integrated circuits that are formed using such transistors. However, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices, at both the device level and within the various metallization layers.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten or aluminum for the conductive lines and vias. The use of low-k dielectric materials tends to improve the signal-to-noise ratio (S/N ratio) by reducing crosstalk as compared to other dielectric materials with higher dielectric constants. However, the use of such low-k dielectric materials may be problematic as they tend to be less resistant to metal migration and tend to be weaker mechanically as compared to some other dielectric materials with higher k values.

Additionally, in many products, various capacitor structures (not shown in FIG. 1) are formed above the transistor device 10 in the various BEOL metallization layers. Such on-chip capacitors are critical components in modern integrated circuit products. Such capacitors are used for a variety of purposes, e.g., coupling/decoupling, bypass and capacitive matching, etc. The capacitors typically come in three distinct forms: MIMCAPs (metal-insulator-metal capacitors), MCAPs (metal capacitors) and VNCAPs (vertical natural capacitors). MIMCAPs are formed by parallel plates of metal at or near the very top of the BEOL metallization layers. MCAPs and VNCAPs are formed by various different types of comb structures that are replicated at multiple levels of the metallization layers. VNCAPs differ from MCAPs in that VNCAPs include connecting vias in the metal comb stacks which results in the VNCAPs having a greater capacitance density.

As noted previously, all of the above-identified capacitor structures are formed in the BEOL metallization layers, where lower k value dielectric materials are normally used to reduce parasitic capacitance and signal-to-noise ratios (S/N ratio). Unfortunately, such lower-k dielectric materials are less than ideal as it relates to the ability to store charge in the capacitor devices. The amount of charge that a capacitor may store is directly related to dielectric constant ('k') of the insulating material used in making the capacitors. Thus, while the use of low-k dielectric materials may reduce parasitic capacitance and signal-to-noise ratios, such low-k material causes problems as it relates to the formation of capacitor structures. For example, the effect of using such low-k materials in the BEOL metallization layers is that the physical size of the capacitor structures formed in such low-k material layers must be increased, as compared to the size of such capacitors if a dielectric material with a higher k-value were used in the BEOL metallization layers. However, the use of a higher k-value dielectric material would offset the advantages achieved by using low-k material in the BEOL metallization layers, such as reducing parasitic capacitance and signal-to-noise ratios, as discussed above.

The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to various embodiments of a capacitor structure positioned at the device level of an integrated circuit product, and various methods of making such capacitors and products. One illustrative integrated circuit product disclosed herein includes a metal-1 metallization layer positioned above a semiconducting substrate, a capacitor positioned in the vertical space defined by a surface of the substrate and a bottom of the metal-1 metallization layer, wherein the capacitor includes a plurality of conductive plates that are oriented in a direction that is substantially normal relative to the surface of the substrate, and at least one region of insulating material positioned between the plurality of conductive plates.

Another illustrative integrated circuit product disclosed herein includes a metal-1 metallization layer positioned above a semiconducting substrate, an isolation region positioned in the substrate, a capacitor positioned in the vertical space defined by a surface of the substrate and a bottom of the metal-1 metallization layer, wherein the capacitor includes a plurality of conductive plates that are positioned above the isolation region and oriented in a direction that is substantially normal relative to the surface of the substrate, and at least one region of insulating material positioned between the plurality of conductive plates, wherein the insulating material has a k-value of at least 3.5.

Yet another illustrative integrated circuit product disclosed herein includes a metal-1 metallization layer positioned above a semiconducting substrate, an isolation region positioned in the substrate that defines an active region in the substrate, a capacitor positioned in the vertical space defined by a surface of the substrate and a bottom of the metal-1 metallization layer, wherein the capacitor includes a plurality of conductive plates that are positioned above the active region and oriented in a direction that is substantially normal relative to the surface of the substrate, and at least one region of insulating material positioned between the plurality of conductive plates, wherein the insulating material has a k-value of at least 3.5.

A method of forming a capacitor and a transistor on a semiconducting substrate is disclosed herein, wherein the capacitor has two outer conductive plates and an inner conductive plate, wherein the method includes performing a first common patterning operation to define a gate electrode for the transistor and a first conductive portion of an inner conductive plate, performing at least one second common process operation that forms a plurality of source/drain interconnects for the transistor and a first conductive portion for each of the two outer conductive plates of the capacitor, and performing at least one third common process operation that forms a plurality of source/drain contacts for the transistor and a second conductive portion for each of the two outer conductive plates of the capacitor.

Another method of forming a capacitor and a transistor on a semiconducting substrate is disclosed herein, wherein the capacitor has two outer conductive plates and an inner conductive plate, wherein the method includes forming a gate electrode for the transistor, performing at least one first common process operation that forms a plurality of source/drain interconnects and a first conductive portion for each of the two outer conductive plates, and performing at least one second common process operation that forms a gate contact and a first conductive portion for the inner conductive plate of the capacitor.

BRIEF DESCRIPTION OF THE DRAWINGS

The disclosure may be understood by reference to the following description taken in conjunction with the accompanying drawings, in which like reference numerals identify like elements, and in which:

FIG. 1 schematically illustrates an illustrative prior art semiconductor device;

FIGS. 2A-2D schematically depict one illustrative embodiment of a capacitor structure disclosed herein;

FIGS. 6A-6F depict one illustrative example of a method of forming the integrated circuit product depicted in FIG. 4B.

Figure 2B:
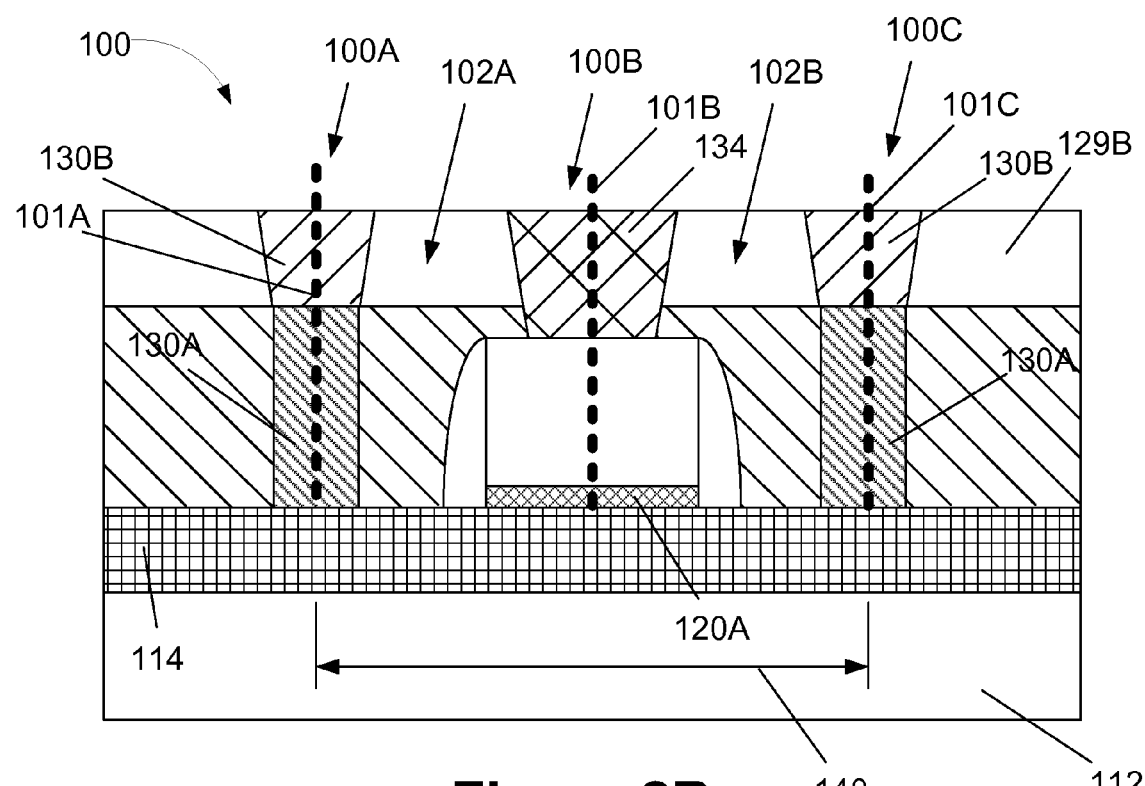

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of a capacitor structure positioned at the device level of an integrated circuit product, and various methods of making such capacitors and products. As will be readily apparent to those skilled in the art upon a complete reading of the present application, the methods and devices disclosed herein may be employed with a variety of technologies, e.g., NFET, PFET, CMOS, etc., and they may be used in manufacturing a variety of devices, including, but not limited to, logic devices, memory devices, and to the manufacture of a variety of electronic products, such as cameras, cell phones, etc. With reference to the attached figures, various illustrative embodiments of the methods and devices disclosed herein will now be described in more detail.

FIGS. 2A-2D depict one illustrative embodiment of a novel capacitor structure 100 disclosed herein that is formed above an isolation region 114 formed in a semiconducting substrate 112. The isolation region 114 is intended to be illustrative in nature as it may be comprised of a variety of different materials, e.g., silicon dioxide, it may take a variety of forms, e.g., a shallow trench isolation, a field isolation region, and it may be formed using known techniques. The substrate 112 may have a variety of configurations, such as the depicted bulk silicon configuration. The substrate 112 may also be made of materials other than silicon. The substrate 112 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" as used herein and in the claims should be understood to cover all semiconductor structures and semiconducting materials, whatever their form or shape.

In the depicted embodiment, the illustrative capacitor structure 100 is generally comprised of three illustrative conductive plates 100A, 100B and 100C. The conductive plates 100A-C are formed in layers of insulating material 129A, 129B. Insulation material 102A separates the conductive plates 100A, 100B. Insulation material 102B separates the conductive plates 100B, 100C. Of course, as will be appreciated by those skilled in the art after a complete reading of the present application, the novel capacitor structures disclosed herein may have any desired number of conductive plates. Moreover, in some applications, any one of the illustrative conductive plates 100A-C may be eliminated to result in a capacitor structure comprised of only two conductive plates. Thus, the inventions disclosed herein should not be considered to be limited to capacitor structures with any particular number of conductive plates.

In one illustrative embodiment, the layers of insulating material 129A, 129B may be comprised of a dielectric material having a k-value of at least 3.5 and, in some cases, a material with a k-value of at least 3.9, with enough mechanical strength to endure the process operations to which they will be exposed. In the depicted example, the conductive plates 100A, 100C (the "outer" conductive plates) are comprised of a plurality of conductive structures 130, wherein a portion of the conductive plates 100A, 100C lands on the isolation region 114. In one embodiment, the conductive plates 100A, 100C may be comprised of a first conductive portion 130A and a second conductive portion 130B. In one illustrative example, as described more fully below, the first conductive portion 130A may be the same as a source/drain interconnect that contacts a source/drain region on a transistor device (formed elsewhere on the substrate 112), and the second conductive portion 130B may be a source/drain contact that contacts the source/drain interconnect.

In the example shown in FIG. 2A, the conductive plate 100B (the "inner" conductive plate) is comprised of a first conductive portion 120B and a second conductive portion 134. In one particular example, as described more fully below, the first conductive portion 120B is the same as the gate electrode portion of a typical gate structure for a transistor device (formed elsewhere on the substrate 112) and the second conductive portion 134 is a gate contact structure. In this example, a portion of the conductive plate 100B lands on a layer of insulating material 120A that is positioned above the isolation region 114. As will be recognized by those skilled in the art after a complete reading of the present application, the insulating material 120A may be the same as the insulating material that is employed in forming gate insulation layers on transistor devices that are formed elsewhere on the substrate 112, as discussed more fully below. In some applications, the insulating material 120A may not be present, i.e., the first conductive portion 120B of the conductive plate 100B may land on the isolation region 114. Also depicted in FIG. 2A are sidewall spacers 126 that are positioned adjacent the first conductive portion 120B of the conductive plate 100B. The spacers 126 may be formed by depositing a layer of spacer material, such as silicon nitride (with a k-value of about 7-8), and thereafter performing an anisotropic etching process on the layer of spacer material.

Of course, as will be recognized by those skilled in the art after a complete reading of the present application, the various components of the conductive plates 100A-C may be different than the illustrative examples depicted herein. The physical size, e.g., length, width, height, etc., of the conductive plates 100A-C may vary depending upon the particular application. However, with reference to FIG. 2B, irrespective of the exact materials, shape and size of the conductive portions of the conductive plates 100A-C, each of the conductive plates 100A-C have an axis 101A-C, respectively, that is oriented in a direction that is generally normal relative to the upper surface of the substrate 112 or the isolation region 114. In one illustrative example, the spacing 140 between the outer conductive plates 100A, 100C may correspond to the tightest pitch that is possible as it relates to semiconductor manufacturing operations, e.g., the spacing 140 may correspond to the poly-pitch employed in manufacturing gate electrodes for transistors elsewhere on the substrate 112.

Figure 2C:
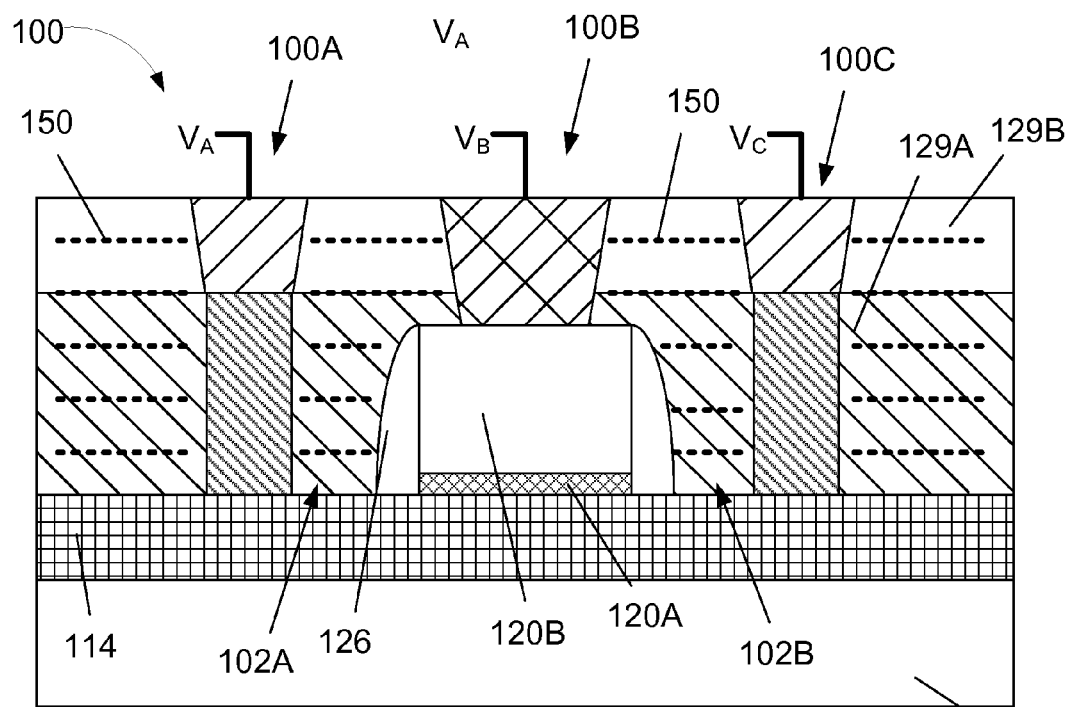

FIG. 2C provides an illustrative example of the operation of the capacitor structure 100 disclosed herein. As depicted therein, a voltage $V_{A-C}$ is applied to each of the conductive plates 100A-C, respectively. In one illustrative embodiment, the inner conductive plate 100B is grounded ($V_B$=GRN), while a positive or negative voltage is applied to each of the outer conductive plates 100A, 100C. The magnitude of the voltages $V_A$, $V_C$ that are applied to the conductive plates 100A, 100C, respectively, may vary depending upon the particular application, and the magnitude of the voltages $V_A$, $V_C$, need not be the same magnitude or polarity. As one example, the voltage $V_A$, $V_C$ applied to the outer conductive plates 100A, 100C may be about 0.8-1.2 volts, while the voltage $V_B$ applied to the inner conductive plate 100B may be about zero volts. The dashed lines 150 reflect the coupling capacitance generated by the capacitor structure 100. In the depicted example, the insulation material 102A is comprised of the portions of the layers of insulating material 129A, 129B (k value of at least 3.5) and the sidewall spacer 126 (e.g., silicon nitride with a k-value of about 7-8) positioned between the conductive plates 100A-B. The insulation material 102B is comprised of the portions of the layers of insulating material 129A, 129B (k value of at least 3.5) and the sidewall spacer 126 (e.g., silicon nitride with a k-value of about 7-8) positioned between the conductive plates 100B-C. Since the capacitor structure 100 is positioned in layers of insulating material(s) having a dielectric constant greater than the low-k materials typically used in BEOL metallization layers, the capacitor structure 100 will have a greater capacitance density as compared to a capacitor formed with such low-k insulating materials. Of course, as will be recognized by those skilled in the art after a complete reading of the present application, if desired, the capacitor structure 100 disclosed herein may also be employed in integrated circuit products where the various metallization layers do not employ so-called low-k insulation layers. Thus, the inventions should not be considered to be limited to only situations where low-k insulating materials are employed in BEOL metallization layers.

Figure 2D:
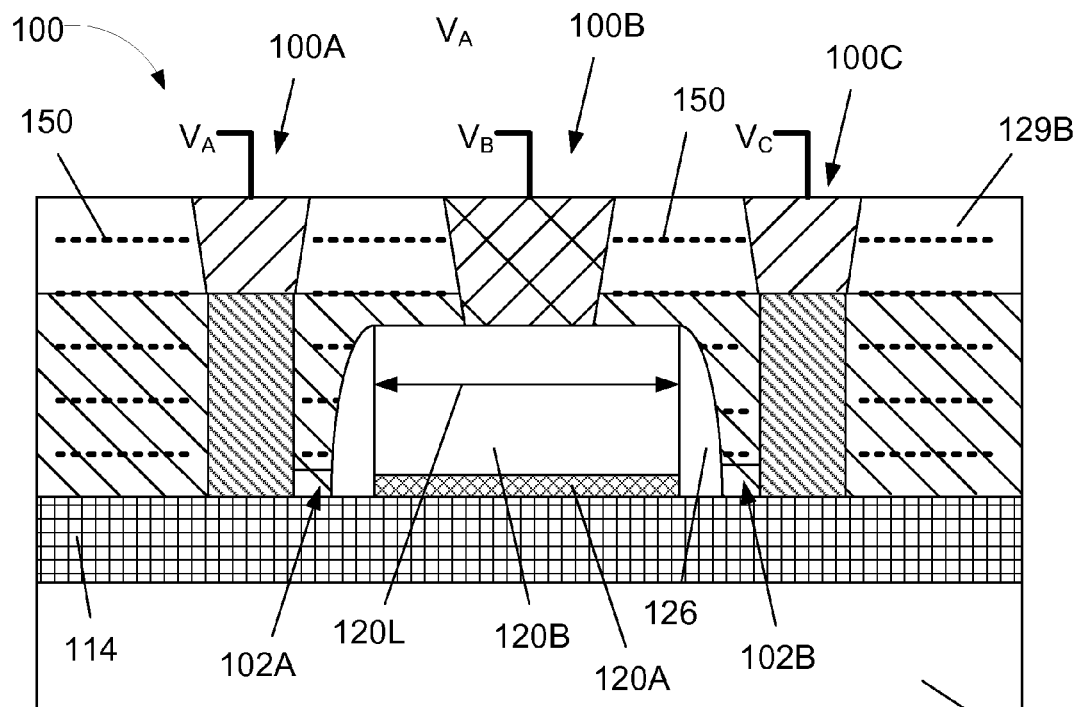

FIG. 2D depicts another illustrative embodiment of a capacitor structure 100 disclosed herein. Using the novel structures and methods disclosed herein, for integrated circuit designs that require higher capacitance coupling, the width 120L of the first conductive portion 120B of the inner conductive plate 100B may be increased to any desired length. Increasing the width 120L, while keeping the distance 140 (see FIG. 2B) between the outer conductive plates 100A, 100C the same effectively reduces the thickness of the insulating materials 102A, 102B in the area adjacent the first portion 120B of the inner conductive plate 100B. In general, the coupling capacitance of a capacitor is inversely proportional to the thickness of the dielectric material between the conductive plates of the capacitor. Accordingly, for a given voltage, as the width 120L of the inner conductive plate 100B is increased, which locally decreases the thickness of the insulating materials 102A, 102B, the coupling capacitance of the capacitor structure 100 is increased.

Figure 3A:
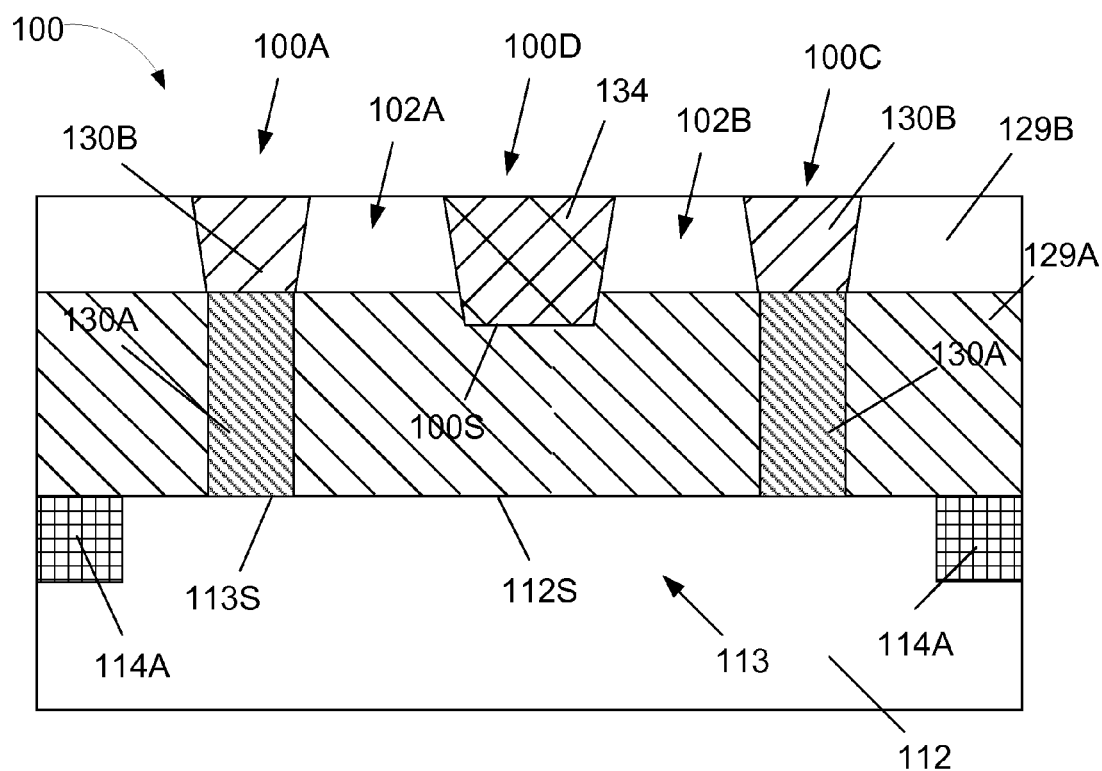
FIGS. 3A-3C schematically depict another illustrative embodiment of a capacitor structure disclosed herein.
Figure 3B:
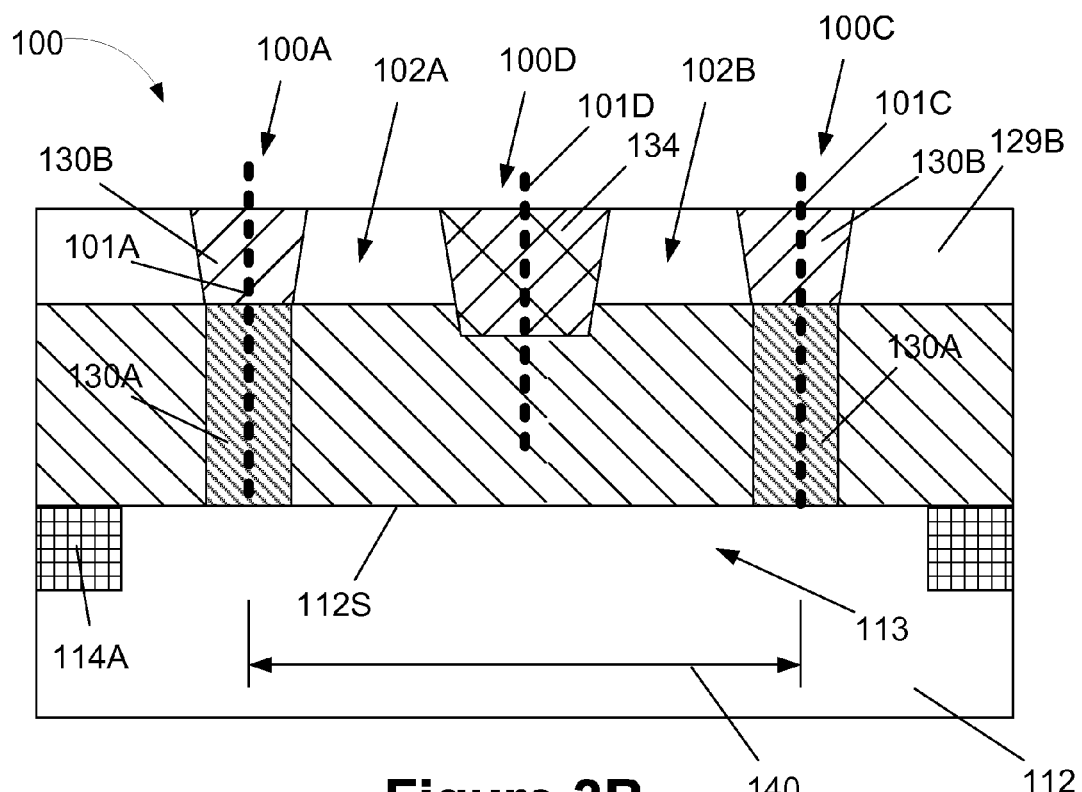
Figure 3C:
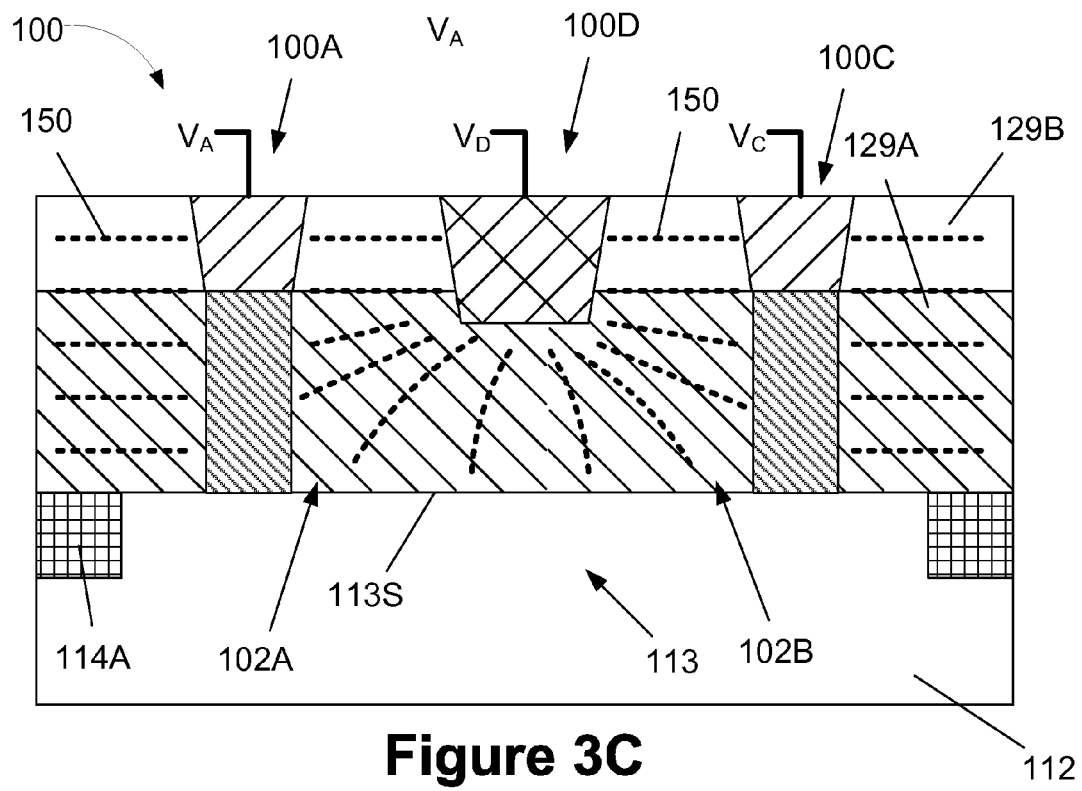

FIGS. 3A-3C depict another illustrative embodiment of a novel a capacitor structure 100 disclosed herein. In this embodiment, the capacitor structure 100 is formed above an active region 113 that is defined in the substrate 112 by an isolation region 114A. In this example, the illustrative capacitor structure 100 is generally comprised of three illustrative conductive plates 100A, 100D and 100C that are formed in the previously described layers of insulating material 129A, 129B. Insulation material 102A separates the conductive plates 100A, 100D. Insulation material 102B separates the conductive plates 100D, 100C. The conductive plates 100A, 100C may have the same structure as previously described. In the depicted example, the outer conductive plates 100A, 100C are comprised of a plurality of conductive structures, wherein a portion of the outer conductive plates 100A, 100C lands on the surface 113S of the active region 113.

As compared to the embodiment shown in FIGS. 2A-2D, in the capacitor 100 shown in FIGS. 3A-3C, the inner conductive plate 100B is replaced with the inner conductive plate 100D. Relative to the previously described conductive plate 100B, in the conductive plate 100D, the first conductive portion 120B (see FIG. 2A) has been eliminated, as has the sidewall spacers 126. That is, in this embodiment, the conductive plate 100D is comprised of only the previously described second conductive portion 134. Accordingly, the bottom surface 100S of the conductive plate 100D is spaced vertically above the surface 112S of the substrate 112.

Of course, as will be recognized by those skilled in the art after a complete reading of the present application, the structure for the inner conductive plate 100D may be different than the illustrative examples depicted herein. For example, the physical size, e.g., length, width, height, etc., of the conductive plates 100A-D may vary depending upon the particular application. However, with reference to FIG. 3B, irrespective of the exact materials, shape and size of the conductive portions of the conductive plates 100A, 100C and 100D, each of the conductive plates 100A, 100C and 100D have a generally vertically oriented axis 101A, 101C and 101D, respectively, relative to the surface 112S of the substrate 112. In one illustrative example, the spacing 140 between the outer conductive plates 100A, 100C may be the same as previously described.

FIG. 3C provides an illustrative example of the operation of the capacitor structure 100 disclosed in FIGS. 3A-3C. As depicted therein, voltages $V_A$, $V_C$, and $V_D$ are applied to each of the conductive plates 100A, 100C and 100D, respectively. In one illustrative embodiment, the conductive plate 100D is grounded ($V_D$=GRN), while a positive or negative voltage is applied to each of the conductive plates 100A, 100C. The magnitude of the voltages $V_A$, $V_C$ may be as previously described. As with the previous embodiment, the dashed lines 150 reflect the coupling capacitance generated by the capacitor structure 100. In the depicted example, the insulation material 102A is comprised of the portion of the layers of insulating material 129A, 129B positioned between the conductive plates 100A, 100D. The insulation material 102B is comprised of the portions of the layers of insulating material 129A, 129B positioned between the conductive plates 100D, 100C. Since the capacitor structure 100 is positioned in layers of insulating material having a dielectric constant greater than the low-k materials used in BEOL metallization layers, the capacitor structure 100 disclosed in FIGS. 3A-3C will have a greater capacitance density as compared to a capacitor formed with such low-k insulating materials.

Figure 4A:
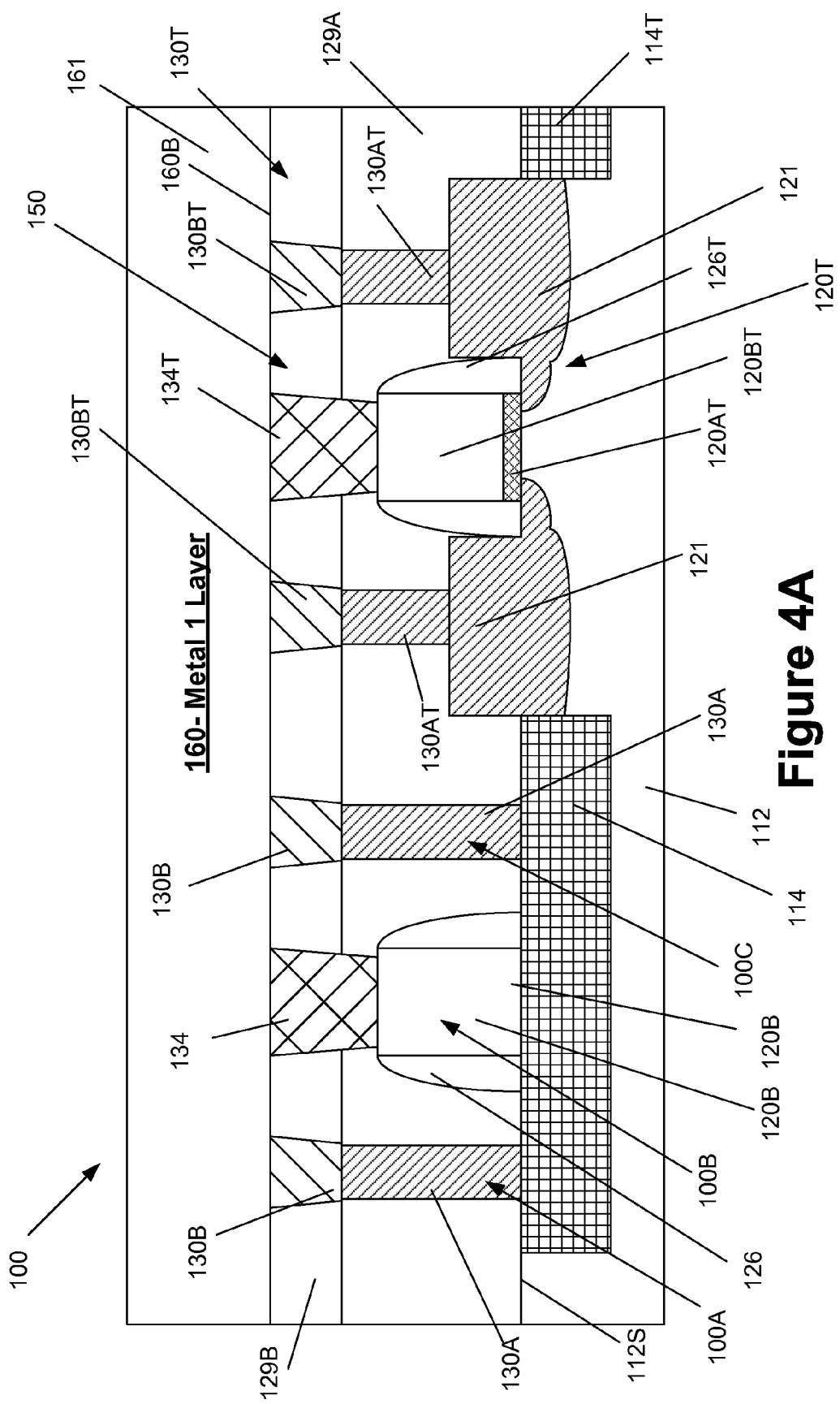
FIGS. 4A-4B are illustrative examples wherein the capacitor structures disclosed herein may be formed on the same substrate as a traditional transistor.
Figure 4B:
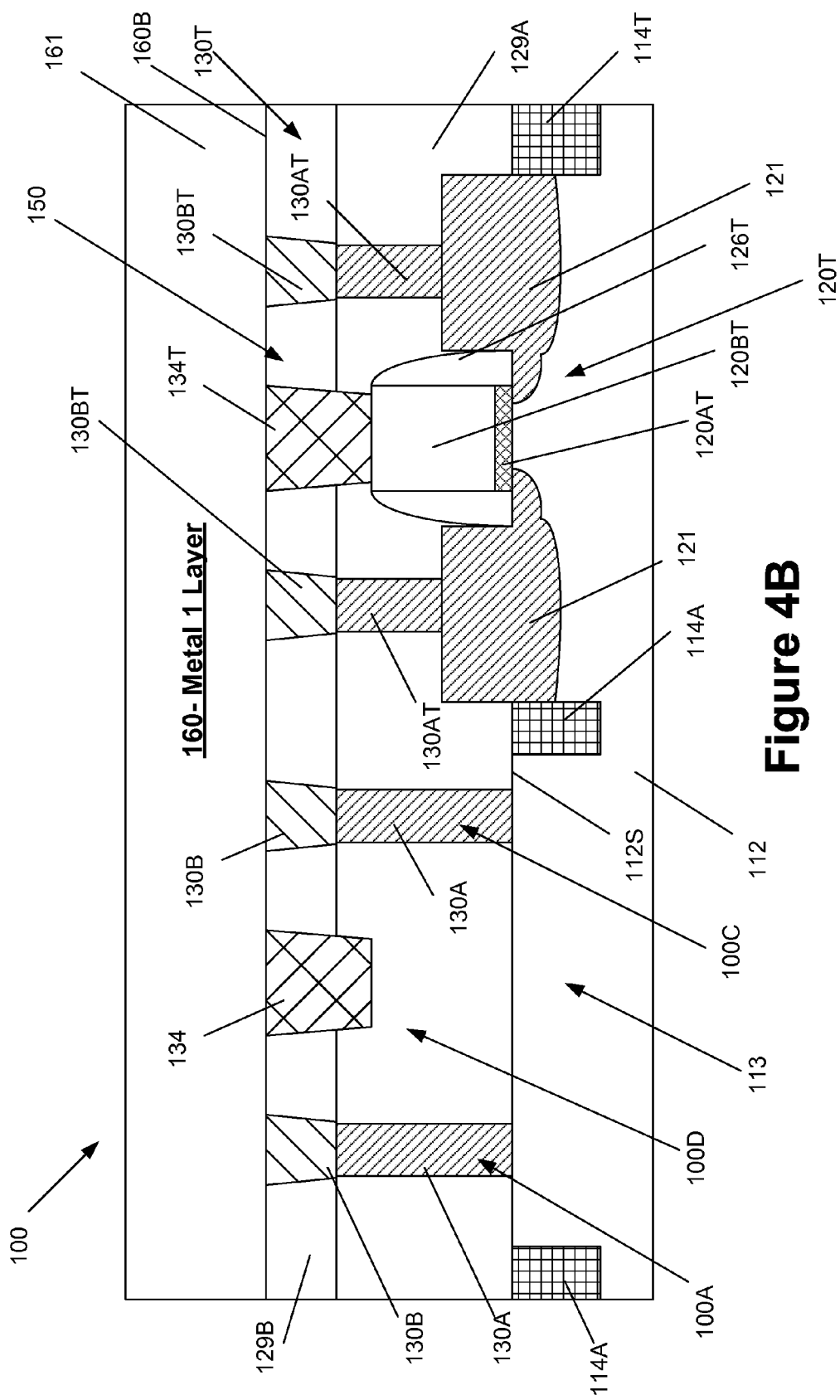

FIGS. 4A-4B are illustrative examples wherein the capacitor structures 100 disclosed in FIGS. 2A-2D and 3A-3C may be formed on the same substrate 112 as a traditional transistor 150. These drawings will be referenced to generally explain how various aspects of the capacitor structures 100 disclosed herein may be fabricated in conjunction with the fabrication of other transistors 150. In general, in one embodiment, various potions of the conductive plates 100A-C are made of the same structures as are employed in making the illustrative transistor 150. Thus, the designation "T" has been added to the corresponding structures of the transistor 150 to facilitate discussion and to hopefully avoid confusion.

The transistor device 150 includes a schematically depicted gate structure 120T that typically includes a gate insulation layer 120AT and a gate electrode 120BT, a plurality of raised source/drain regions 121, sidewall spacers 126T, and a plurality of metal silicide regions (not shown). Also depicted in FIG. 4A are a plurality of conductive source/drain contact structures (generally designated by the number 130T) that are conductively coupled to the source/drain regions 121 and a conductive gate contact structure 134T that is conductively coupled to the gate electrode 120BT. In the depicted example, conductive structures 130T are comprised of a source/drain interconnect 130AT and a source/drain contact 130BT. In this example, the raised source/drain regions 121 are contacted by source/drain interconnect 130AT. The gate electrode 120BT is electrically contacted by the gate contact structure 134T. Such conductive structures 130AT, 130BT, 134 are formed in the layers of insulating material 129A, 129B, and they may take a variety of forms and they may be made of any electrically conductive material, e.g., a metal, metal alloys, doped semiconductor materials, polysilicon, etc. The transistor 150 may be fabricated using the same techniques as that described above for the prior art transistor 10 depicted in FIG. 1.

FIG. 4A also schematically depicts what is generally referred to in the industry as the so-called "metal-1" layer 160. Generally, the metal-1 layer 160 contains the first layer of the general wiring pattern for the integrated circuit product. However, as mentioned above in connection with the discussion of FIG. 1, a plurality of additional metallization layers (not shown in FIG. 4A) are typically formed above the transistor 150/capacitor 100, e.g., the integrated circuit may have about 7-14 metallization layers, one of which is the metal-1 layer 160. The metallization layers are comprised of conductive lines and/or conductive vias (not shown) that are positioned in a layer of insulating material, such as the illustrative layer of low-k insulating material 161 for the metal-1 layer 160. The capacitor structure 100 shown in FIG. 4A has been previously described with reference to FIGS. 2A-2D. In general, the capacitor structure 100 is positioned within the vertical space defined by the upper surface 112S of the substrate 112 and the bottom 160B of the metal-1 layer 160.

With continuing reference to FIG. 4A, it is important to note that, in one embodiment, the same conductive structures that define the outer conductive plates 100A, 100C, e.g., 130A, 130B, may be the same as the conductive source/drain contact structures 130T, e.g., 130AT, 130BT, employed in making conductive connections to the source/drain regions 121 of the transistor 150. Note, however, that since the transistor 150 has raised source/drain regions 121, the axial length of the contacts 130AT, 130A may be different. Similarly, in this example, the conductive structures that define the conductive plate 100B, e.g., the gate electrode 120B and the gate contact 134 are the same as employed in making the gate electrode 120BT and the gate contact 134T. In the depicted example, the gate insulation layer 120AT for the transistor 150 is not present under the corresponding conductive portion 120B for the conductive plate 100B because, in this example, the gate insulation layer 120AT was formed by performing a thermal growth process. Since the conductive plate 100B is positioned above the isolation region 114, the thermally grown gate insulation layer 120AT will not grow on the isolation region 114.

FIG. 4B depicts the illustrative example wherein the capacitor structure 100 disclosed herein in FIGS. 3A-3C may be formed on the same substrate 112 as the previously described transistor 150. The capacitor structure 100 shown in FIG. 4B has been previously described with reference to FIGS. 3A-3C. With continuing reference to FIG. 4B, it is important to note that, in one embodiment, the conductive plates 100A, 100C may be made of the same conductive structures, e.g., structures 130A, 130B, as are employed in making conductive source/drain connections 130T to the source/drain regions 121 of the transistor 150, e.g., structures 130AT, 130BT. Similarly, in this example, the conductive plate 100D is made of a gate contact 134 that corresponds to the gate contact 134T employed in manufacturing the transistor 150.

Figure 5A:
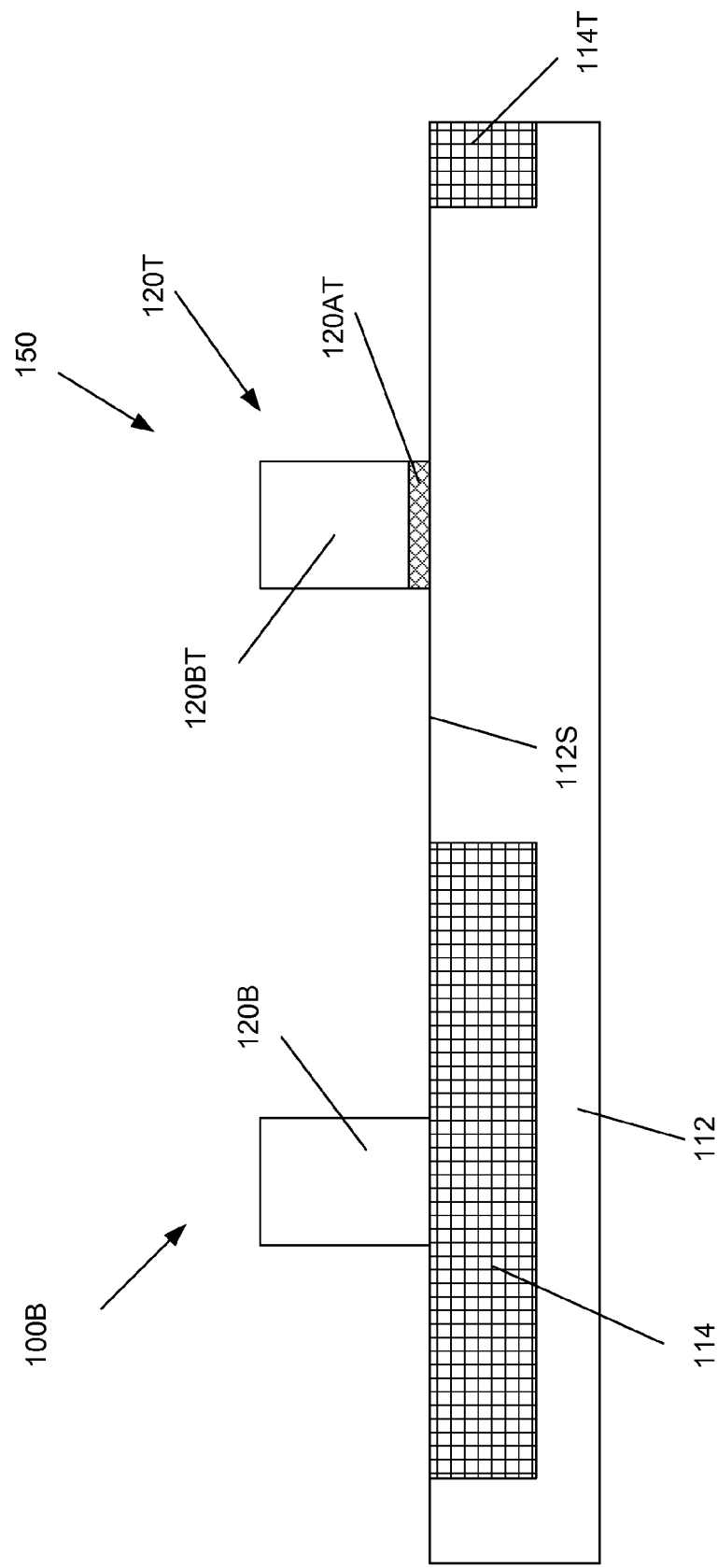
FIGS. 5A-5F depict one illustrative example of a method of forming the integrated circuit product depicted in FIG. 4A.

Importantly, given the unique configuration and structures of the capacitor structure 100 disclosed herein, the capacitor structure 100 may be fabricated at the same time as the transistor 150 is fabricated. FIGS. 5A-5F depict one illustrative example of a method of forming the integrated circuit product depicted in FIG. 4A. FIG. 5A depicts the integrated circuit product at an early stage of manufacture. As shown therein, isolation regions 114, 114T have been formed in the substrate 112, the gate structure 120T for the transistor 150 and the first conductive portion 120B of the inner conductive plate 100B has been formed. Various ion implant processes may be performed after the formation of the isolation regions 114, 114T, e.g., well regions, but such regions are not depicted in the drawings. In this example, at the time the gate electrode 120BT is formed for the gate structure 120T, at least the corresponding conductive structure 120B may be formed for the capacitor structure 100. As a result, the gate electrode 120BT and at least the conductive structure 120B of the inner conductive plate 100B may have the same configuration, materials of construction and dimensions. In one embodiment, the gate electrode 120BT and the conductive structure 120B may be formed by depositing a layer of gate electrode material, e.g., polysilicon, and thereafter patterning the layer of gate electrode material using known photolithography and etching techniques. If desired, as noted above with respect to FIG. 2D, the width 120L of the conductive structure 120B for the capacitor may be patterned so as to be wider than the gate length of the transistor 150. After the gate structure 120T is formed, various implant regions may be formed in the substrate 112 proximate the gate structure 120T, e.g., halo implant regions, extension implant regions, etc. However, such implant regions are not depicted in the drawings.

Figure 5B:
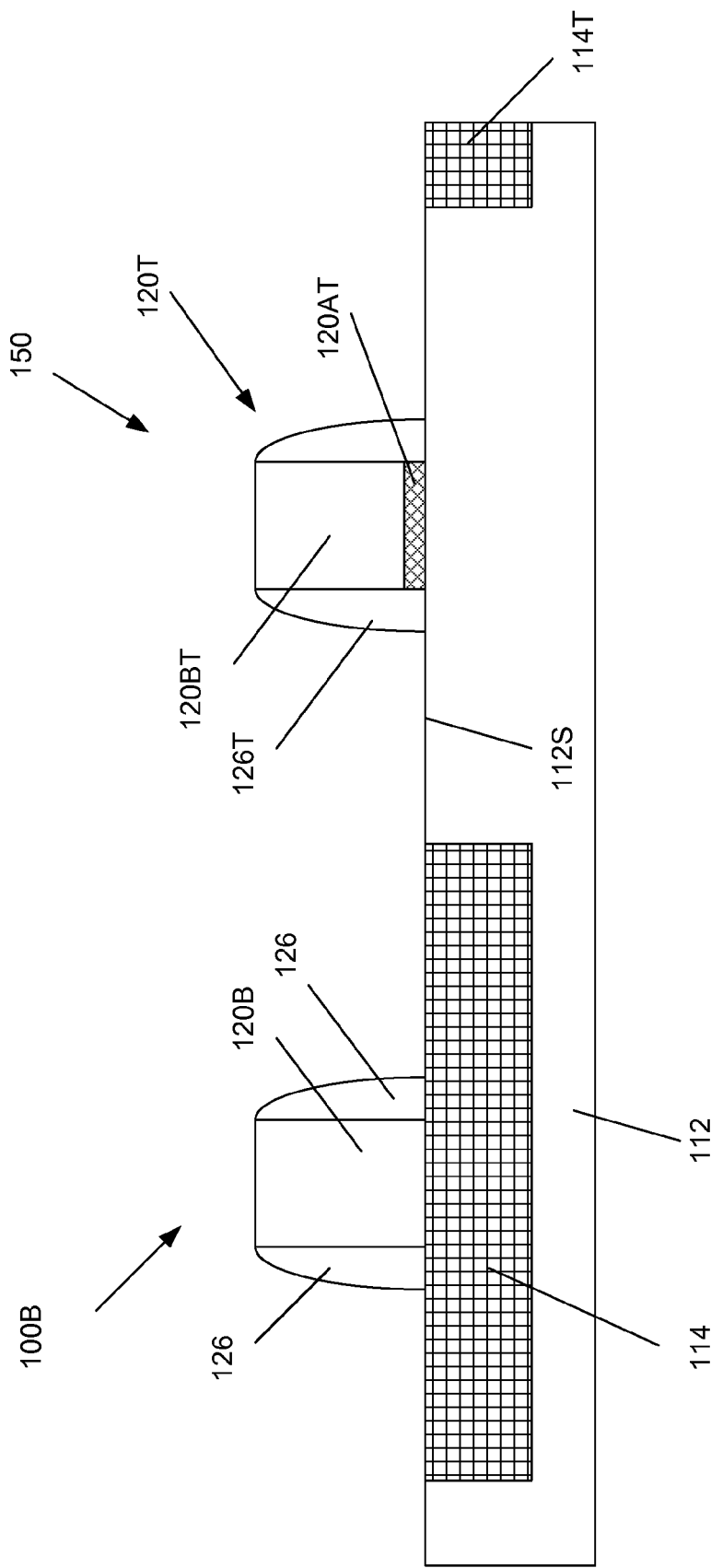

Next, as shown in FIG. 5B, sidewall spacers 126, 126T are formed on the conductive structure 120B and the gate structure 120T of the transistor 150. The sidewall spacers 126, 126T may be formed by depositing a layer of spacer material, such as silicon nitride, and thereafter performing an anisotropic etching process on the layer of spacer material.

Figure 5C:
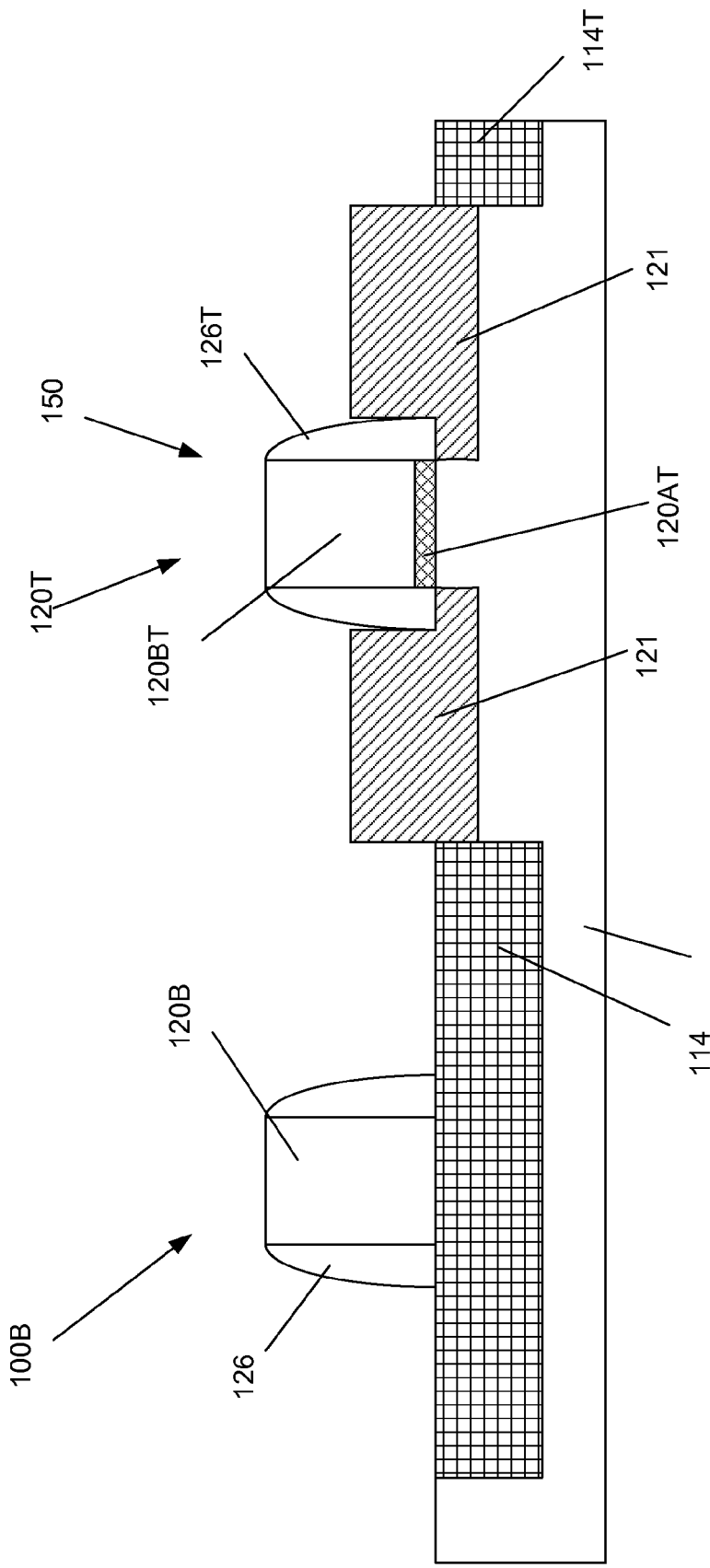

Then, as shown in FIG. 5C, the illustrative raised source/drain regions 121 may be formed using known techniques. Formation of the raised source/drain regions 121 generally involves forming cavities in the substrate 112 proximate the gate structure 120T and thereafter performing an epitaxial process to grow or deposit semiconductor material, e.g., a doped silicon/germanium material, in the cavities.

Figure 5D:
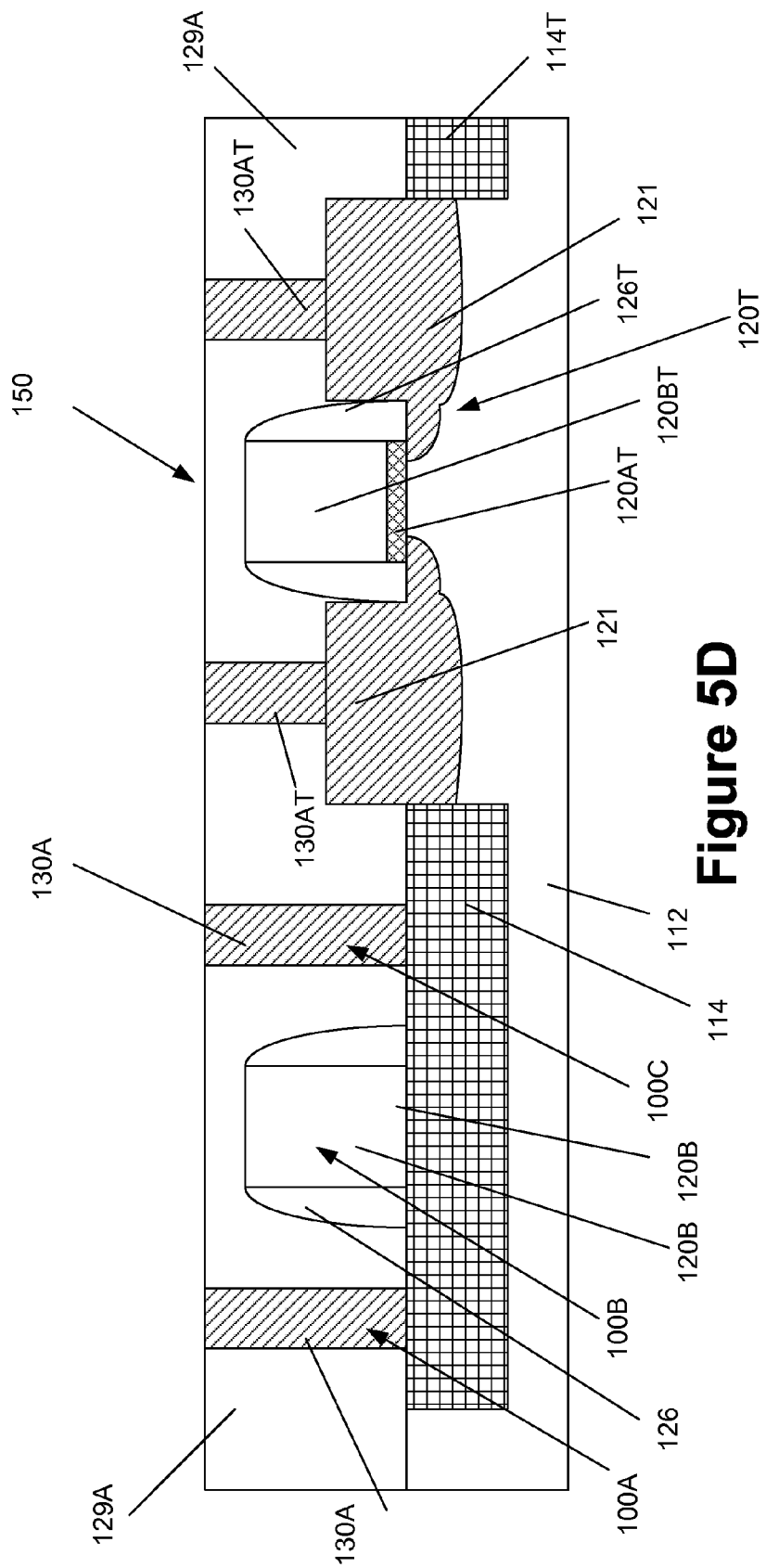

Next, as shown in FIG. 5D, an anneal process has been performed on the device to activate the implanted dopant materials and repair any damage to the silicon lattice structure of the substrate 112. After the anneal process, the layer of insulating material 129A is deposited on the device and the source/drain interconnects 130AT (for the transistor 150) and the first conductive portion 130A (for each of the outer conductive plates 100A, 100C) are formed at the same time by performing at least one common process operation. That is, the conductive structures 130AT, 130A are formed at the same time using the same manufacturing processes and materials. Formation of the conductive structures 130AT, 130A typically involve patterning the layer of insulating material 129A to form contact openings, depositing a conductive material, e.g., a metal such as tungsten, so as to overfill the contact openings, and performing a chemical mechanical polishing (CMP) process to remove excess portions of the conductive material that are positioned outside of the contact openings to thereby define the conductive structures 130AT, 130A.

Figure 5E:
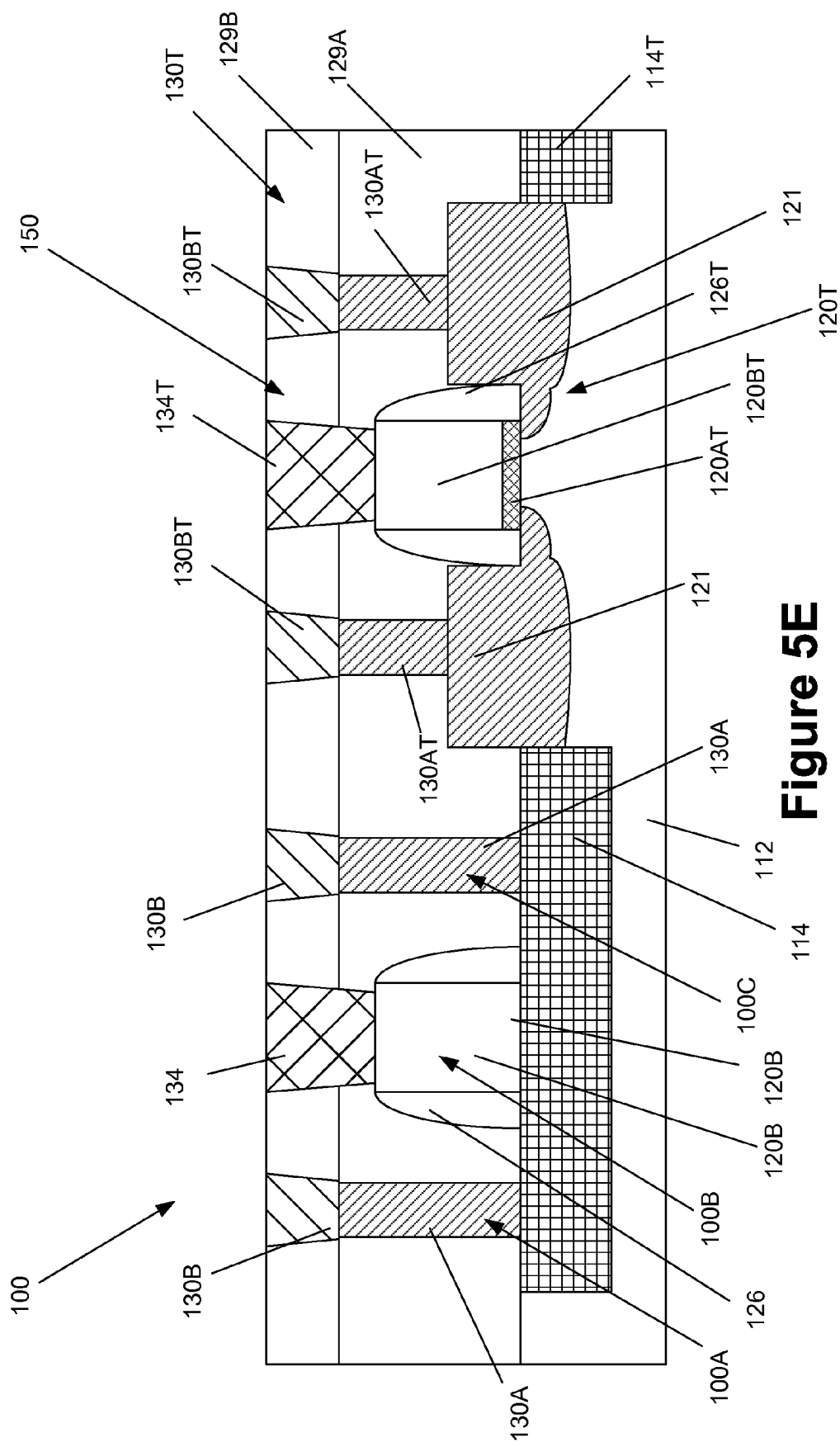

Next, as shown in FIG. 5E, the layer of insulating material 129B is deposited on the device and the source/drain contacts 130BT (for the transistor 150) and the second conductive portions 130B (for each of the outer conductive plates 100A, 100C) are formed at the same time by performing at least one common process operation. The conductive gate contact 134T (for the transistor 150) and the second conductive portion 134 (of the inner conductive plate 100B) are also formed in the layer of insulating material 129A at the same time by performing at least one common process operation. In one embodiment, the conductive structures 130BT, 130B, 134T and 134 are all formed at the same time using the same manufacturing processes and materials. In another embodiment, the conductive structures 130BT, 130B are formed at a different time in the process flow than the conductive structures 134T, 134. In the latter cases, the conductive structures may be made of different materials. Formation of the conductive structures 130BT, 130B, 134T, 134 typically involves patterning the layer of insulating material 129B to form contact openings, depositing a conductive material, e.g., a metal such as tungsten, so as to overfill the contact openings, and performing a CMP process to remove excess portions of the conductive material that are positioned outside of the contact openings to thereby define the conductive structures.

Figure 5F:
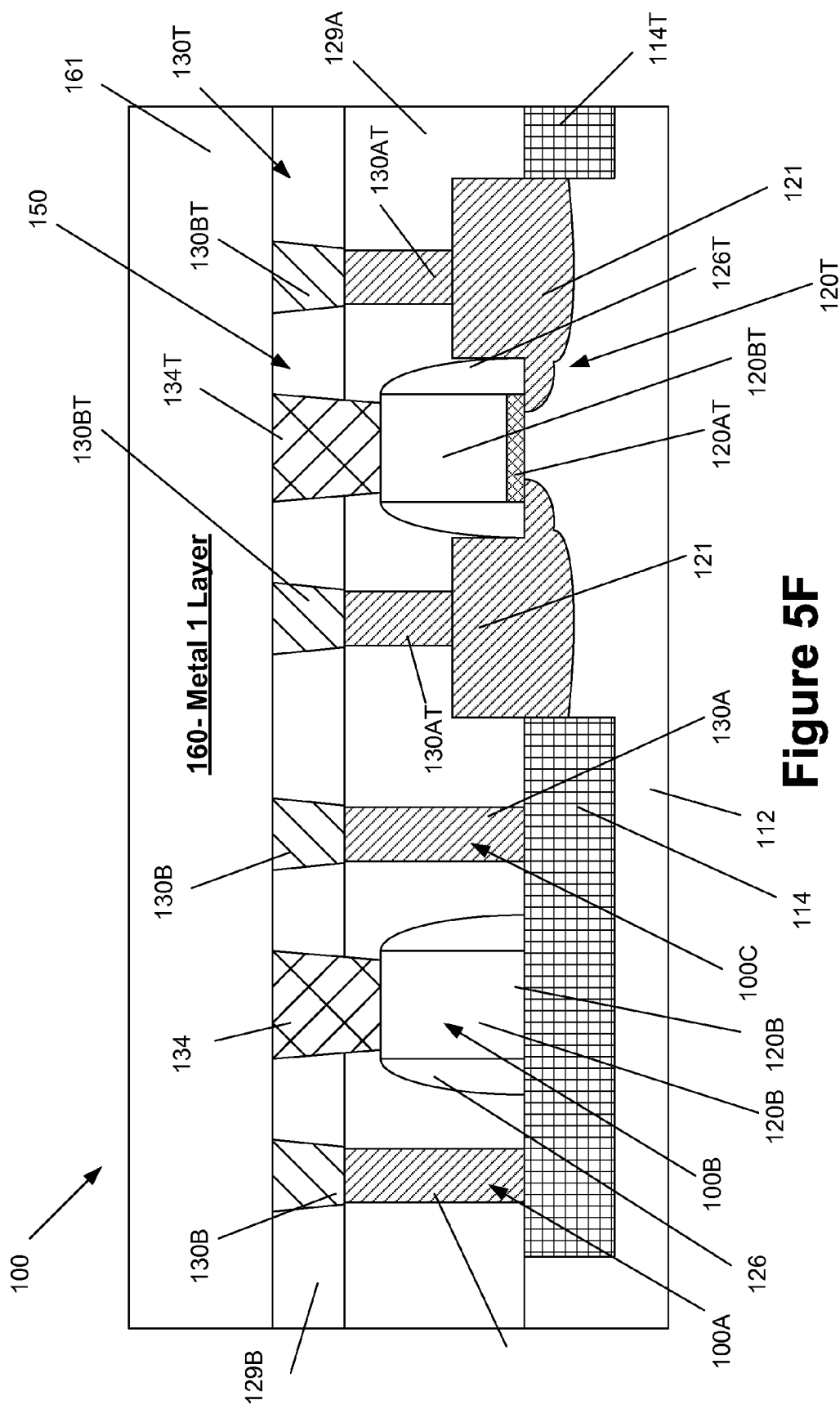

Next, as shown in FIG. 5F, the metal-1 layer 160 is formed above the layer of insulating material 129B. As noted above, the metal-1 layer 160 is comprised of conductive lines and/or vias (not shown) that are positioned in the layer of low-k insulating material 161. As noted above, the capacitor structures 100 disclosed herein are formed at the device level of the integrated circuit product, i.e., above the surface of the substrate 112 and below the metal-1 layer 160.

As noted above, the conductive portion 120B of the conductive plate 100B may be comprised of the materials that are used in forming gate structures 120T for other transistors 150. In such a case, the gate electrodes 120BT of the gate structures and the conductive portion 120B of the inner conductive plate 100B may be comprised of a variety of different materials, e.g., polysilicon, one or more metal layers, etc. Moreover, the gate electrodes 120BT of the gate structures 120T and the conductive portion 120B of the conductive plate 100B may be made using either so-called "gate-first" or "gate-last" techniques. Similarly, the gate insulation layer 120AT for the transistor 150 may be made of materials such as silicon dioxide, a high-k insulating material (k value greater than 10).

Figure 6A:
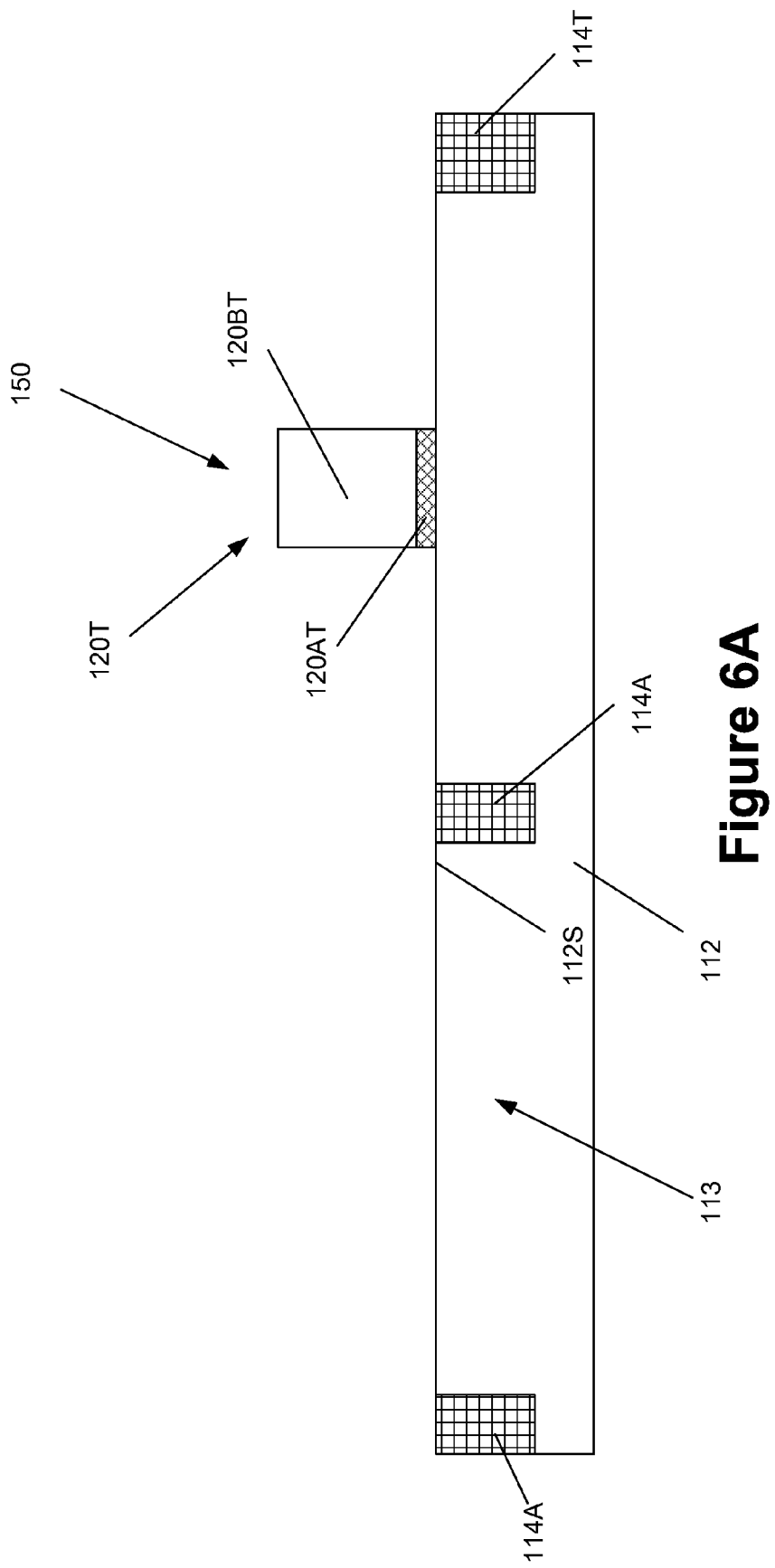

FIGS. 6A-6F depict one illustrative example of a method of forming the integrated circuit product depicted in FIG. 4B. FIG. 6A depicts the integrated circuit product at an early stage of manufacture. As shown therein, isolation regions 114A, 114T have been formed in the substrate 112 and the gate structure 120T for the transistor 150 has been formed. In this embodiment, the capacitor 100 is formed above the active region 113 defined by the isolation region 114A. Moreover, in this embodiment, the inner conductive plate of the capacitor 100 does not include a conductive portion that corresponds to the gate electrode 120BT of the transistor 150. To achieve this structure, the active region 113 may be masked when the gate electrode material is initially deposited, or the gate electrode material may be deposited above the active region 113 and thereafter removed by performing known masking and etching processes.

Figure 6C:
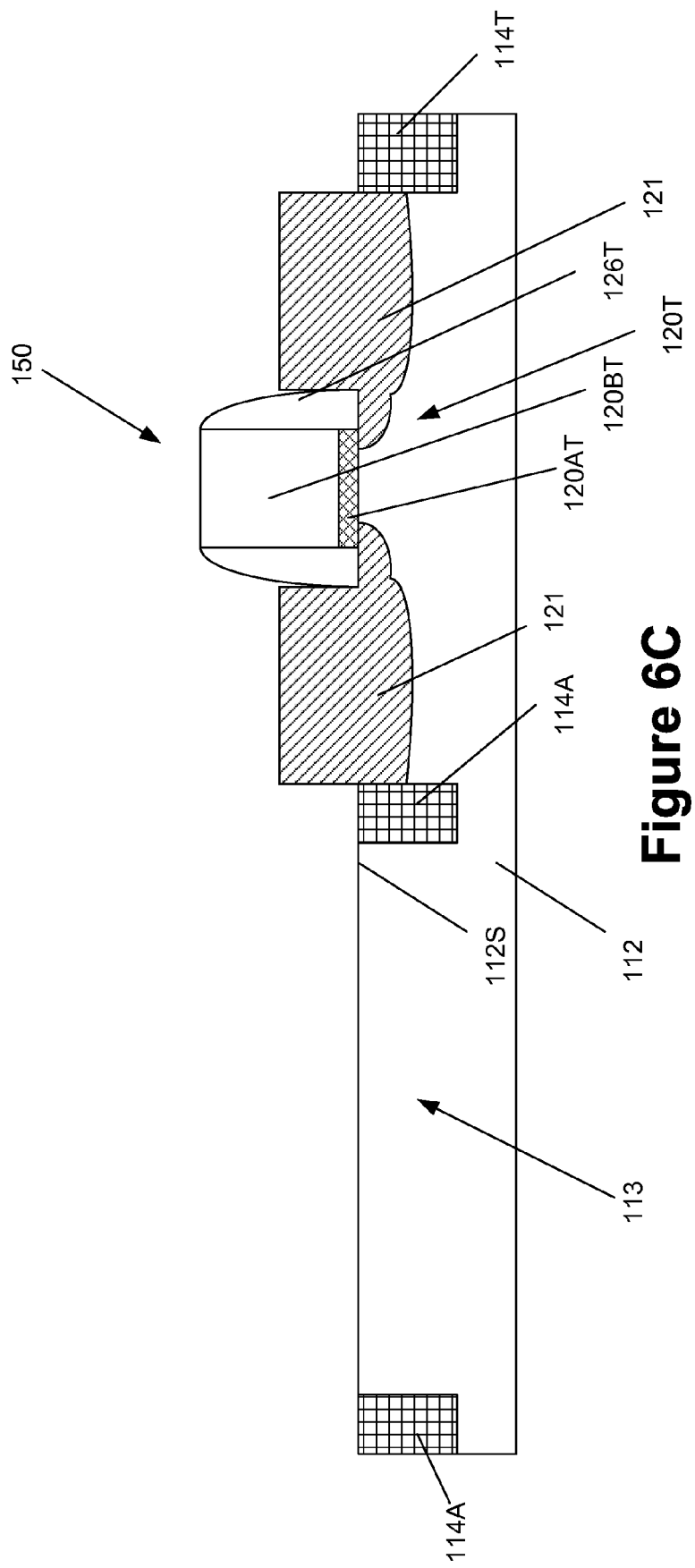
Figure 6D:
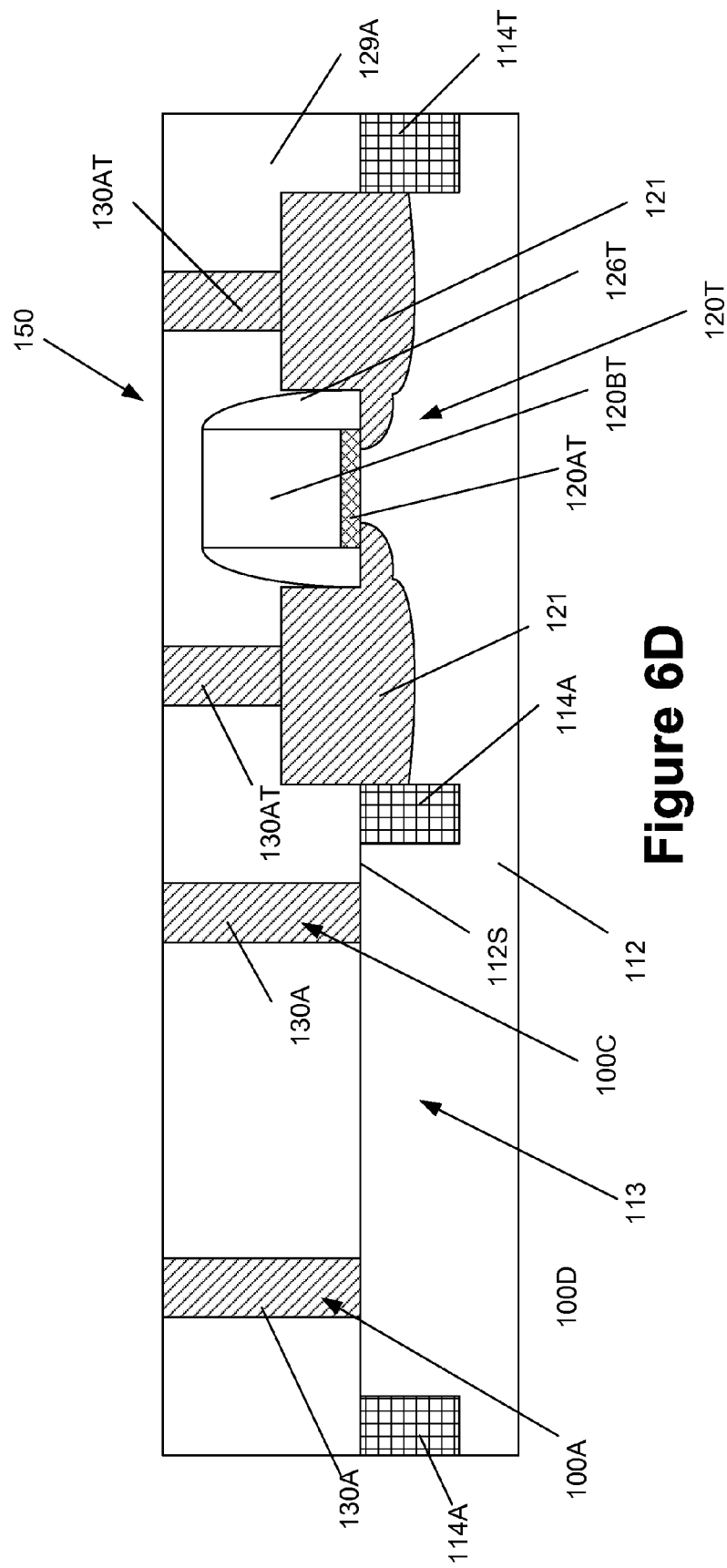
Figure 6E:
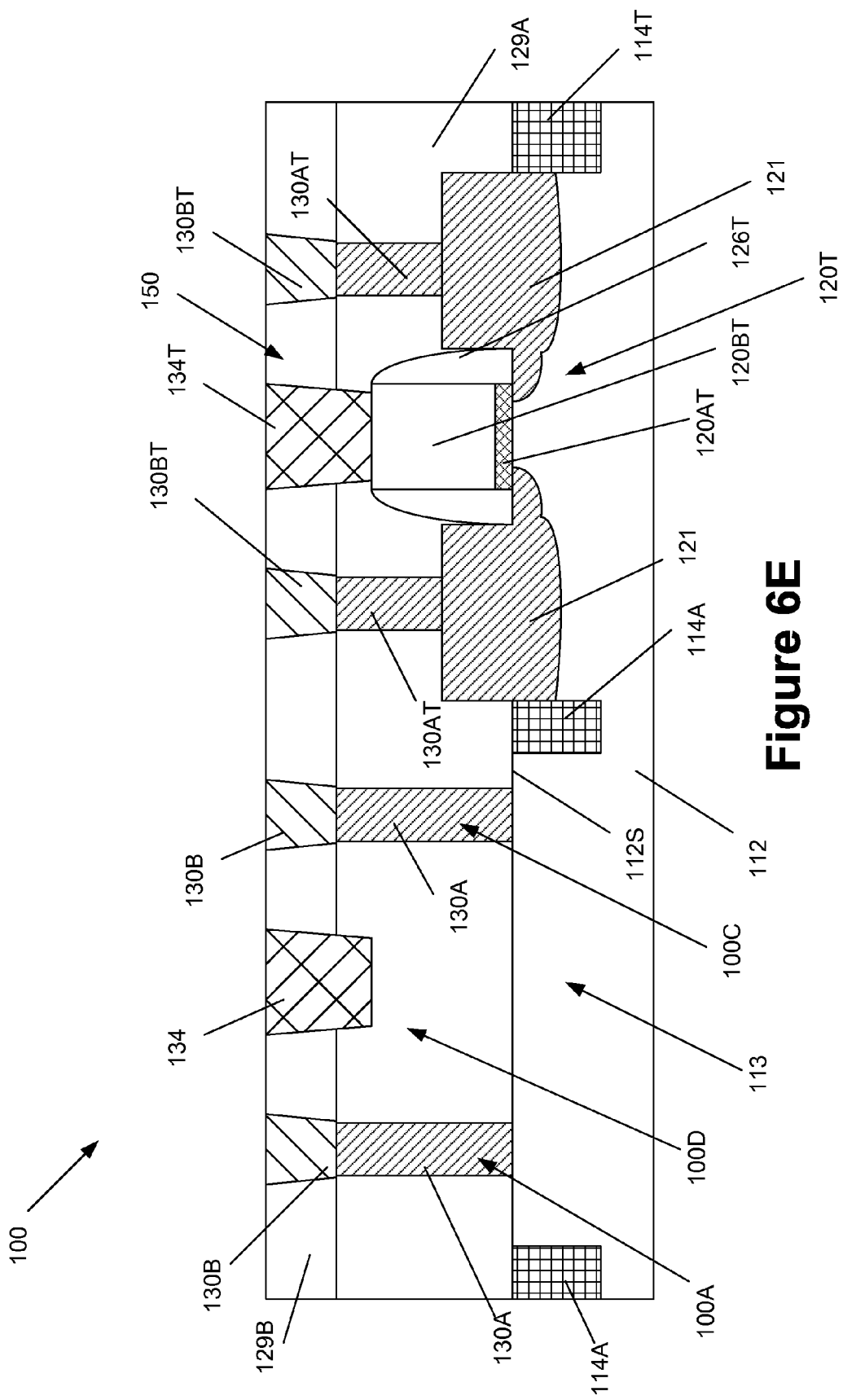
Figure 6F:
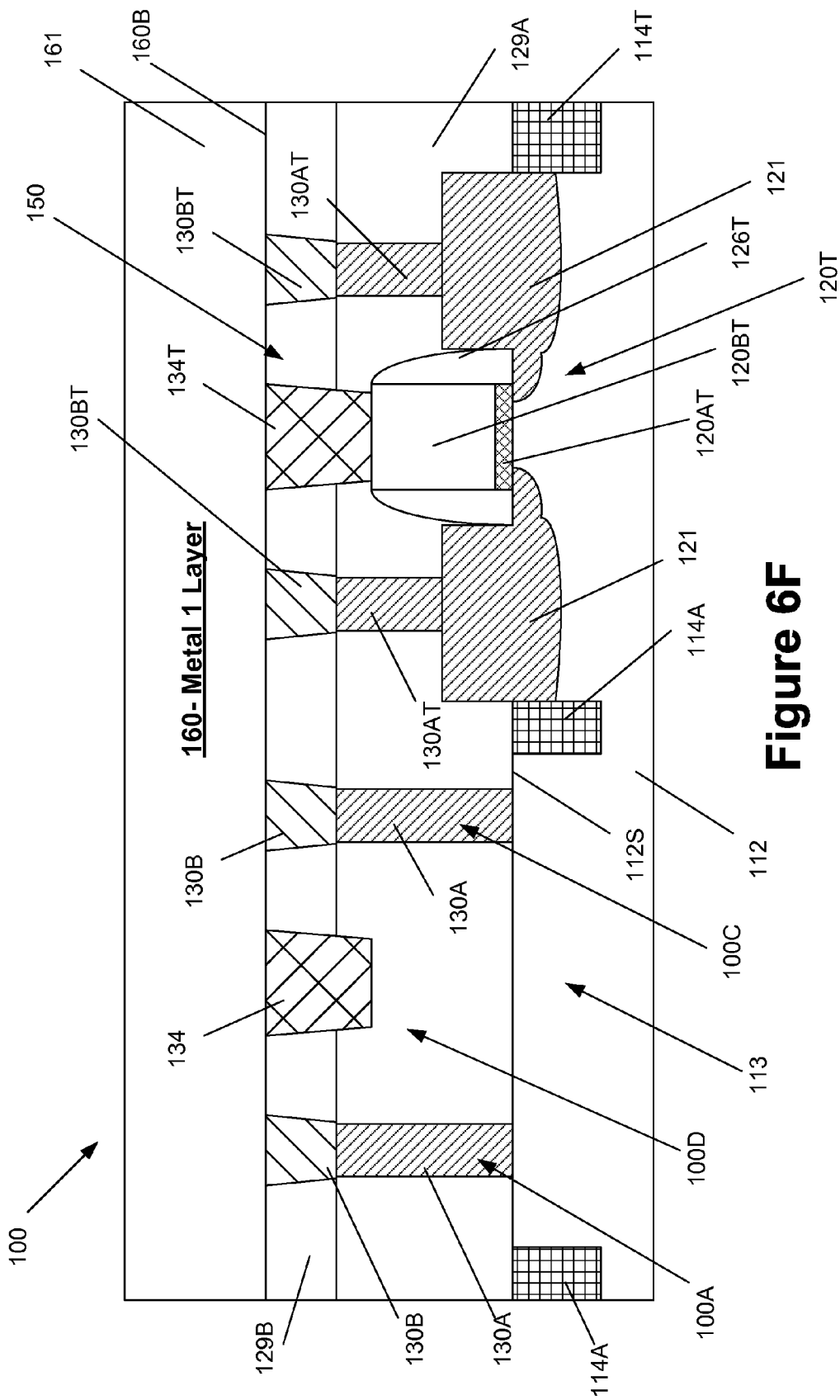

Next, as shown in FIG. 6B, sidewall spacers 126T are formed on the gate structure 120T of the transistor 150. FIG. 6C depicts the device after the illustrative raised source/drain regions 121 have been formed (as previously described) and after the activation anneal process has been performed. With reference to FIG. 6D, the layer of insulating material 129A is then deposited on the device and the conductive structures 130AT, 130A are formed for the transistor 150 and the outer conductive plates 100A, 100C, respectively. Again, the conductive structures 130AT, 130A are formed at the same time using the same manufacturing processes and materials. Next, as shown in FIG. 6E, the layer of insulating material 129B is deposited on the device and the conductive structures 130BT, 130B are formed for the transistor 150 and the outer conductive plates 100A, 100C, respectively. The conductive structures 134T, 134 are also formed in the layer of insulating material 129B for the transistor 150 and the inner conductive plate 100D, respectively. In one embodiment, the conductive structures 130BT, 130B, 134T and 134 are all formed at the same time using the same manufacturing processes and materials. In another embodiment, the conductive structures 130BT, 130B are formed at a different time in the process flow than the conductive structures 134T, 134. Next, as shown in FIG. 6F, the metal-1 layer 160 is formed above the layer of insulating material 129B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a capacitor and a transistor on a semiconducting substrate, wherein the capacitor is comprised of two outer conductive plates and an inner conductive plate positioned between said outer conductive plates, and wherein said transistor is comprised of a gate electrode, a plurality of source/drain interconnects, a plurality of source/drain contacts and a gate contact, the method comprising:
    performing a first common patterning operation to define said gate electrode and a first conductive portion of said inner conductive plate;
    performing at least one second common process operation that forms said plurality of source/drain interconnects and a first conductive portion for each of said two outer conductive plates; and
    performing at least one third common process operation that forms said plurality of source/drain contacts and a second conductive portion for each of said two outer conductive plates.

2. The method of claim 1, further comprising performing at least one fourth common process operation that forms said gate contact and a second conductive portion for said inner conductive plate.

3. The method of claim 2, wherein said third and fourth common process operations are performed at the same time.

4. The method of claim 2, wherein said fourth process operation is performed after said third process operation is performed.

5. The method of claim 1, wherein said first common patterning operation comprises forming a etch mask above a layer of gate electrode material and performing an etching process on said layer of gate electrode material to define said gate electrode and said first conductive portion of said inner conductive plate.

6. The method of claim 1, wherein performing at least one second common process operation comprises:
    forming a layer of insulating material above said substrate;
    defining a plurality of openings in said layer of insulating material;
    depositing a conductive material in said openings in said layer of insulating material; and
    performing a chemical mechanical polishing process to thereby define said plurality of source/drain interconnects and said first conductive portion for each of said two outer conductive plates.

7. The method of claim 1, wherein performing at least one third common process operation comprises:
    forming a layer of insulating material above said substrate;
    defining a plurality of openings in said layer of insulating material;
    depositing a conductive material in said openings in said layer of insulating material; and
    performing a chemical mechanical polishing process to thereby define said plurality of source/drain contacts and said second conductive portion for each of said two outer conductive plates.

8. The method of claim 2, wherein performing at least one fourth common process operation comprises:
    forming a layer of insulating material above said substrate;
    defining a plurality of openings in said layer of insulating material;
    depositing a conductive material in said openings in said layer of insulating material; and
    performing a chemical mechanical polishing process to thereby define said gate contact and said second conductive of said inner conductive plate.

9. The method of claim 1, wherein said inner and outer conductive plates of said capacitor are positioned above an isolation region formed in said substrate and wherein at least said first conductive portion of each of said outer conductive plates lands on said isolation region.

10. The method of claim 9, wherein said first conductive portion of said inner conductive plate lands on said isolation region.

11. A method of forming a capacitor and a transistor on a semiconducting substrate, wherein the capacitor is comprised of two outer conductive plates and an inner conductive plate positioned between said outer conductive plates, and wherein said transistor is comprised of a gate electrode, a plurality of source/drain interconnects, a plurality of source/drain contacts and a gate contact, the method comprising:
    forming said gate electrode for said transistor;
    performing at least one first common process operation that forms said plurality of source/drain interconnects and a first conductive portion for each of said two outer conductive plates; and
    performing at least one second common process operation that forms said gate contact and a first conductive portion for said inner conductive plate.

12. The method of claim 11, further comprising performing at least one third common process operation that forms said plurality of source/drain contacts and a second conductive portion for each of said two outer conductive plates.

13. The method of claim 12, wherein said second and third process operations are performed at the same time.

14. The method of claim 12, wherein said third process operation is performed after said second process operation.

15. The method of claim 12, wherein said second process operation is performed after said third process operation.

16. The method of claim 11, wherein said inner and outer conductive plates of said capacitor are positioned above an active region of said substrate and wherein at least said first conductive portion of each of said outer conductive plates lands on said active region.

17. The method of claim 16, wherein said first conductive portion of said inner conductive plate has a bottom surface that is vertically spaced apart from an upper surface of said active region.

18. A method of forming a capacitor and a transistor on a semiconducting substrate, wherein the capacitor is comprised of two outer conductive plates and an inner conductive plate positioned between said outer conductive plates, and wherein said transistor is comprised of a gate electrode, a plurality of source/drain interconnects, a plurality of source/drain contacts and a gate contact, the method comprising:
    forming said gate electrode for said transistor;
    performing at least one first common process operation that forms said plurality of source/drain interconnects and a first conductive portion for each of said two outer conductive plates; and
    performing at least one second common process operation that forms said plurality of source/drain contacts and a second conductive portion for each of said two outer conductive plates and forms said gate contact and a first conductive portion for said inner conductive plate.

19. A method of forming a capacitor and a transistor on a semiconducting substrate, wherein the capacitor is comprised of two outer conductive plates and an inner conductive plate positioned between said outer conductive plates, and wherein said transistor is comprised of a gate electrode, a plurality of source/drain interconnects, a plurality of source/drain contacts and a gate contact, the method comprising:

forming said gate electrode for said transistor;

performing at least one first common process operation that forms said plurality of source/drain interconnects and a first conductive portion for each of said two outer conductive plates;

performing at least one second common process operation that forms said plurality of source/drain contacts and a second conductive portion for each of said two outer conductive plates; and after performing said second common process operation, performing at least one third common process operation that forms said gate contact and a first conductive portion for said inner conductive plate.

* * * * *